United States Patent
Ouyang

(10) Patent No.: US 11,087,984 B2
(45) Date of Patent: Aug. 10, 2021

(54) SELECTIVE DEPOSITION BY LASER HEATING FOR FORMING A SEMICONDUCTOR STRUCTURE

(71) Applicant: Taiwan Semiconductor Manufacturing Co., Ltd., Hsinchu (TW)

(72) Inventor: Christine Y Ouyang, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 115 days.

(21) Appl. No.: 16/247,822

(22) Filed: Jan. 15, 2019

(65) Prior Publication Data

US 2020/0135465 A1 Apr. 30, 2020

Related U.S. Application Data

(60) Provisional application No. 62/751,749, filed on Oct. 29, 2018.

(51) Int. Cl.
| | |
|---|---|
| *H01L 21/033* | (2006.01) |
| *H01L 21/027* | (2006.01) |
| *H01L 21/311* | (2006.01) |
| *H01L 29/66* | (2006.01) |
| *C23C 16/02* | (2006.01) |
| *C23C 16/455* | (2006.01) |
| *H01L 21/28* | (2006.01) |

(52) U.S. Cl.
CPC ...... *H01L 21/0337* (2013.01); *C23C 16/0209* (2013.01); *C23C 16/45525* (2013.01); *H01L 21/0272* (2013.01); *H01L 21/28247* (2013.01); *H01L 21/31144* (2013.01); *H01L 29/66795* (2013.01)

(58) Field of Classification Search
CPC ........... H01L 21/0337; H01L 29/66795; H01L 21/0272; H01L 21/31144; H01L 21/28247; C23C 16/0209; C23C 16/45525
See application file for complete search history.

(56) References Cited

U.S. PATENT DOCUMENTS

| | | | |
|---|---|---|---|
| 2007/0072355 A1* | 3/2007 | Yamamoto ...... | H01L 21/823814 438/199 |
| 2009/0117726 A1* | 5/2009 | Pas ................... | H01L 29/66636 438/592 |
| 2016/0181120 A1* | 6/2016 | Hawryluk ............. | H01L 21/324 438/14 |

* cited by examiner

*Primary Examiner* — Michael Jung
(74) *Attorney, Agent, or Firm* — McClure, Qualey & Rodack, LLP

(57) ABSTRACT

A method for forming a semiconductor structure is provided. The method includes forming a first material and a second material on a semiconductor substrate. The first material is different from the second material. The method also includes heating the first material to a first temperature and the second material to a second temperature with a laser beam. The first temperature is different from the second temperature. The method also includes depositing a third material on the first material.

20 Claims, 21 Drawing Sheets

SELECTIVE DEPOSITION BY LASER HEATING FOR FORMING A SEMICONDUCTOR STRUCTURE

CROSS REFERENCE TO RELATED APPLICATIONS

This application claims the benefit of U.S. Provisional Application No. 62/751,749 filed on Oct. 29, 2018, and entitled "SELECTIVE DEPOSITION THROUGH LASER HEATING", the entirety of which is incorporated by reference herein.

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography and etching processes to form circuit components and elements thereon.

Although existing semiconductor manufacturing processes have generally been adequate for their intended purposes, as device scaling-down continues, they have not been entirely satisfactory in all respects.

BRIEF DESCRIPTION OF THE DRAWINGS

Aspects of the present disclosure are best understood from the following detailed description when read with the accompanying figures. It should be noted that, in accordance with standard practice in the industry, various features are not drawn to scale. In fact, the dimensions of the various features may be arbitrarily increased or reduced for clarity of discussion.

FIGS. 1E' is a cross-sectional view illustrating a stage of a method for forming a semiconductor structure in accordance with some embodiments.

FIGS. 2B' is a cross-sectional view illustrating a stage of a method for forming a semiconductor structure in accordance with some embodiments.

DETAILED DESCRIPTION

Figure 1A:
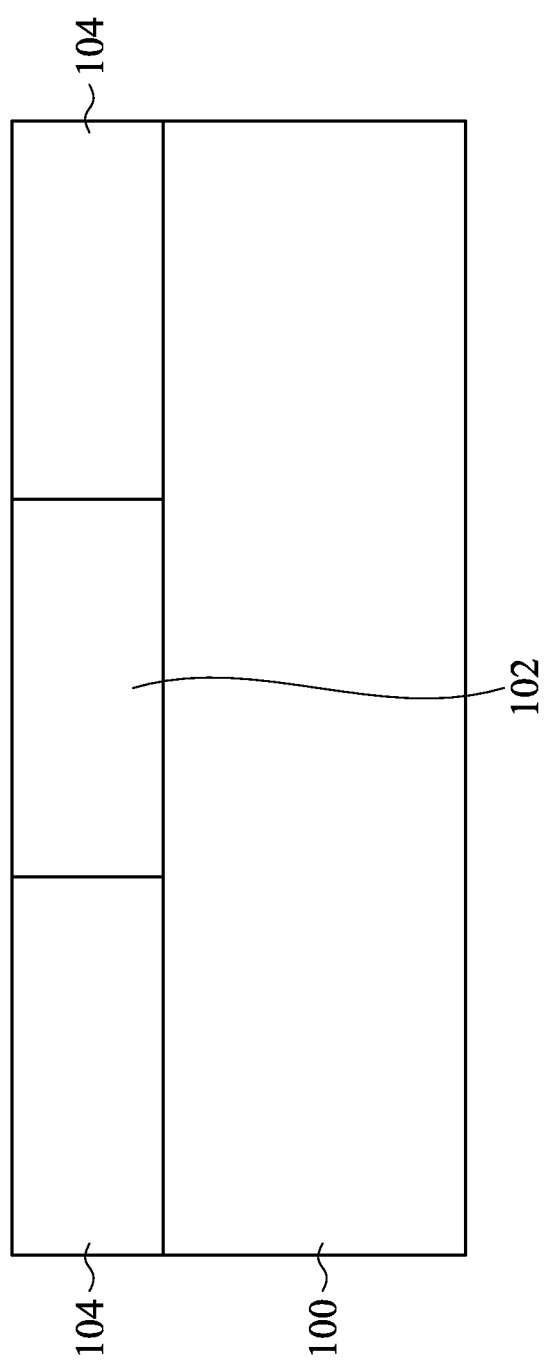
FIGS. 1A, 1B, 1C, 1D, 1E and 1F are a series of cross-sectional views illustrating various stages of a method for forming a semiconductor structure in accordance with some embodiments.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Furthermore, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. It should be understood that additional operations can be provided before, during, and after the method, and some of the operations described can be replaced or eliminated for other embodiments of the method.

Fin structures described below may be patterned by any suitable method. For example, the fins may be patterned using one or more lithography processes, including double-patterning or multi-patterning processes. Generally, double-patterning or multi-patterning processes combine lithography and self-aligned processes, allowing patterns to be created that have, for example, pitches smaller than what is otherwise obtainable using a single, direct lithography process. For example, in one embodiment, a sacrificial layer is formed over a substrate and patterned using a lithography process. Spacers are formed alongside the patterned sacrificial layer using a self-aligned process. The sacrificial layer is then removed, and the remaining spacers may then be used to pattern the fins.

Embodiments of methods for forming semiconductor structures are provided. The method may include forming a first material and a second material on a semiconductor substrate. The first material and the second material may be heated with a laser beam, so that a third material may be selectively formed on the first material.

FIGS. 1A, 1B, 1C, 1D, 1E and 1F are cross-sectional representations of various stages of a method for forming a semiconductor structure, in accordance with some embodiments of the present disclosure.

A semiconductor substrate 100 is provided, as shown in FIG. 1A in accordance with some embodiments. The semiconductor substrate 100 may be a semiconductor wafer such as a silicon wafer. The semiconductor substrate 100 may include elementary semiconductor materials, compound semiconductor materials, and/or alloy semiconductor materials. Examples of the elementary semiconductor materials may include, but are not limited to, crystal silicon, polycrystalline silicon, amorphous silicon, germanium, and/or diamond. Examples of the compound semiconductor materials may include, but are not limited to, silicon carbide, gallium arsenide, gallium phosphide, indium phosphide, indium arsenide, and/or indium antimonide. Examples of the alloy semiconductor materials may include, but are not limited to, SiGe, GaAsP, AlInAs, AlGaAs, GaInAs, GaInP, and/or GaInAsP. In some embodiments, the semiconductor substrate 100 includes an epitaxial layer. For example, the semiconductor substrate 100 may have an epitaxial layer overlying a bulk semiconductor. In some embodiments, the semiconductor substrate 100 includes a semiconductor-on-insulator (SOI) substrate. The SOI substrate may be fabricated using a wafer bonding process, a silicon film transfer process, a separation by implantation of oxygen (SIMOX) process, another applicable process, or a combination thereof.

Various active elements (not shown) may be formed in and/or over the semiconductor substrate 100. Examples of the various active elements include transistors, diodes, another applicable element, or a combination thereof. For example, the transistors may be metal oxide semiconductor field effect transistors (MOSFET), complementary metal oxide semiconductor (CMOS) transistors, bipolar junction transistors (BJT), high-voltage transistors, high-frequency transistors, p-channel and/or n-channel field effect transistors (PFETs/NFETs). In some embodiments, the semiconductor substrate 100 includes a fin field effect transistor (FinFET). Various passive elements (not shown) may be formed in and/or over the semiconductor substrate 100. Examples of the various passive elements include capacitors, inductors, resistors, another applicable passive element, or a combination thereof. Various processes, such as front-end-of-line (FEOL) semiconductor fabrication processes, may be performed to form the various active elements and passive elements. The FEOL semiconductor fabrication processes may include deposition, etching, implantation, lithography, annealing, planarization, one or more other applicable processes, or a combination thereof.

In some embodiments, isolation features (not shown) are formed in the semiconductor substrate 100. The isolation features may be used to define active regions and electrically isolate various elements formed in and/or over the semiconductor substrate 100 in the active regions. In some embodiments, the isolation features include shallow trench isolation (STI) features, local oxidation of silicon (LOCOS) features, other suitable isolation features, or a combination thereof.

Afterwards, a first structure 102 and a second structure 104 are formed over the semiconductor substrate 100, as shown in FIG. 1A in accordance with some embodiments. The top surface of the first structure 102 is substantially level with the top surface of the second structure 104, as shown in FIG. 1A in accordance with some embodiments. In some embodiments, the top surface of the first structure 102 and the top surface of the second structure 104 are coplanar. In some embodiments, the top surface of the first structure 102 is higher or lower than the top surface of the second structure 104.

The first structure 102 is made of a first material, and the second structure 104 is made of a second material that is different from the first material, in accordance with some embodiments.

In some embodiments, the first material of the first structure 102 is a metal (e.g., tungsten, titanium, aluminum, copper, molybdenum, nickel, platinum, another applicable metal, or a combination thereof), and the second material of the second structure 104 is a dielectric material (e.g., silicon oxide, silicon nitride, and metal oxide). In some embodiments, the first material of the first structure 102 is a dielectric material, and the second material of the second structure 104 is a metal.

In some embodiments, either the first material of the first structure 102 or the second material of the second structure 104 is a semiconductor material (e.g., silicon), and the other, either the first material or the second material, is a dielectric material (e.g., silicon oxide, silicon nitride, and metal oxide). In some embodiments, either the first material of the first structure 102 or the second material of the second structure 104 is a metal, and the other, either the first material or the second material, is a semiconductor material.

The second structure 104 is an interlayer dielectric layer, and the first structure 102 is a gate structure disposed in the interlayer dielectric layer, in accordance with some embodiments. In some embodiments, the second structure 104 is an interlayer dielectric layer, and the first structure 102 is a contact structure (e.g., a source/drain contact structure) disposed in the interlayer dielectric layer. For example, the interlayer dielectric layer may be made of silicon oxide, silicon oxynitride, tetraethoxysilane, phosphosilicate glass (PSG), borophosphosilicate glass (BPSG), fluorosilicate glass (FSG), hydrogen silsesquioxane (HSQ), other applicable dielectric materials, or a combination thereof. For example, the gate structure may be made of tungsten, titanium, aluminum, copper, molybdenum, nickel, platinum, another applicable conductive material, or a combination thereof. For example, the contact structure may be made of tungsten, cobalt, titanium, aluminum, copper, tantalum, platinum, molybdenum, silver, manganese, zirconium, ruthenium, another applicable conductive material, or a combination thereof.

For example, the first structure 102 and the second structure 104 may be formed by a chemical vapor deposition (CVD) process (e.g., a high-density plasma chemical vapor deposition (HDPCVD) process, an atmospheric pressure chemical vapor deposition (APCVD) process, a low-pressure chemical vapor deposition (LPCVD) process, and a plasma enhanced chemical vapor deposition (PECVD) process), a spin-on coating process, a physical vapor deposition process (e.g., a sputtering process, and an evaporation process), another applicable process, or a combination thereof.

Figure 1B:
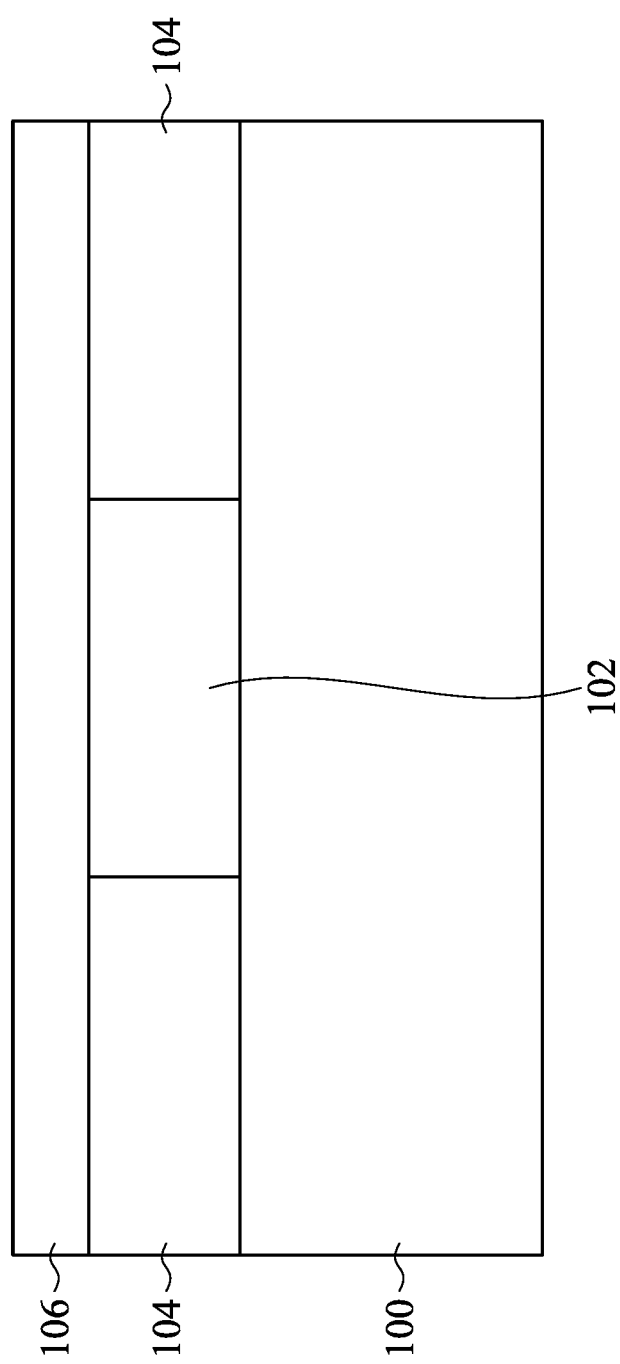

Afterwards, a heat-curable layer 106 is formed on the first structure 102 and the second structure 104, as shown in FIG. 1B in accordance with some embodiments. The heat-curable layer 106 may include monomers and/or crosslinkers for forming a polymer material (e.g., polyimide, polyethylene, polymethylmathacrylate, polystyrene another applicable polymer material, or a combination thereof). For example, the heat-curable layer 106 may be formed on the first structure 102 and the second structure 104 using a spin-on coating process, a vapor coating process, a spray coating process, another applicable process, or a combination thereof.

Figure 1C:
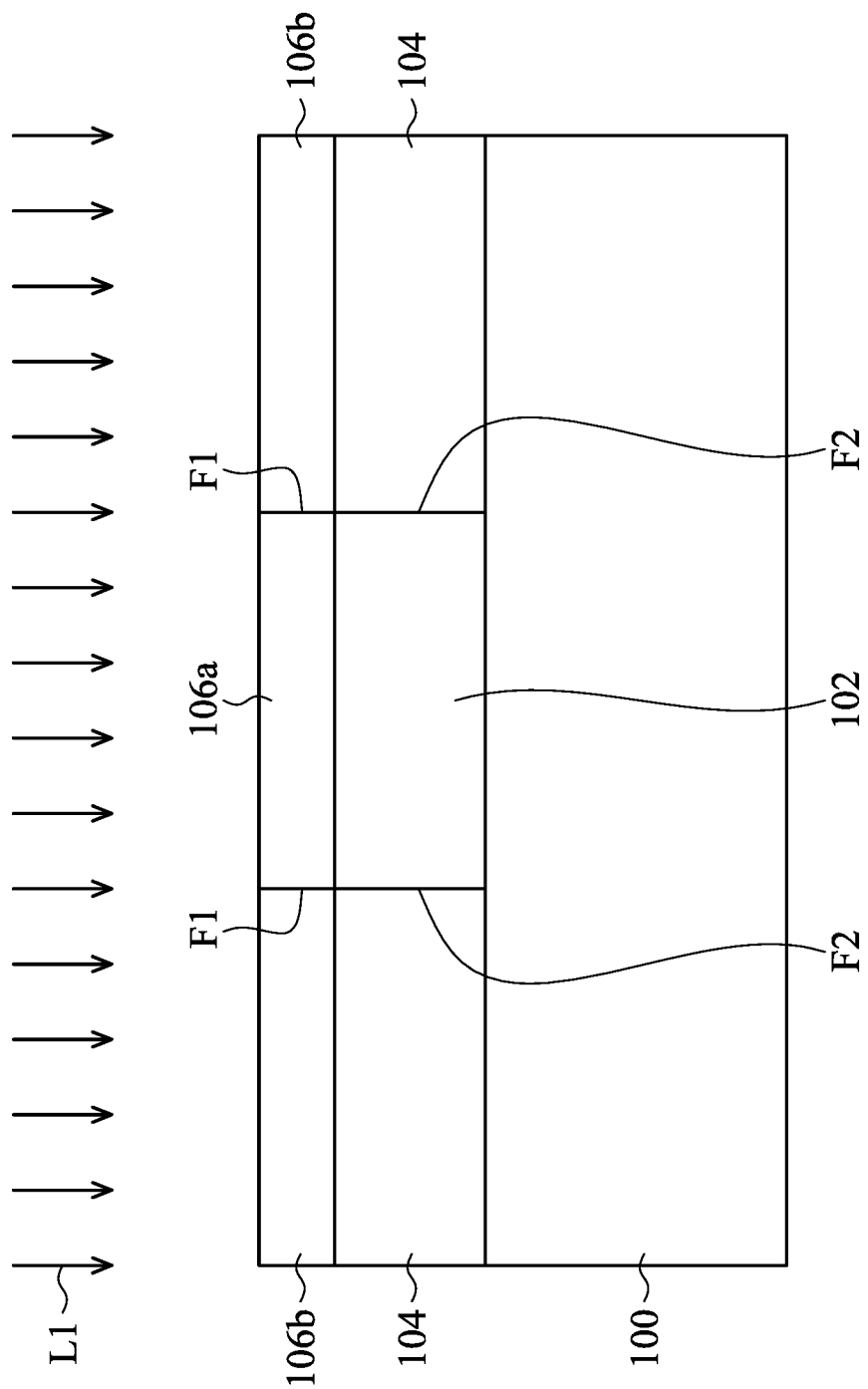

Afterwards, a laser beam L1 is applied to heat the first structure 102 and the second structure 104, as shown in FIG. 1C in accordance with some embodiments. For example, the first structure 102 and the second structure 104 may be heated by scanning the first structure 102 and the second structure 104 with the laser beam L1. The laser beam L1 may be perpendicular to the top surfaces of the first structure 102 and the second structure 104 or have any appropriate tilt angle according to design requirements.

The laser absorption coefficient C1 of the first material of the first structure 102 with respect to the laser beam L1 is lower than the laser absorption coefficient C2 of the second material of the second structure 104 with respect to the laser beam L1, in accordance with some embodiments. In some embodiments, the laser absorption coefficient C2 is higher than the laser absorption coefficient C1, so that the first structure 102 is heated by the laser beam L1 to a first temperature A1 and the second structure 104 is heated by the laser beam L1 to a second temperature A2 which is higher than the first temperature A1.

In some embodiments, the first temperature A1 of the first structure 102 is not high enough to cure a portion 106a of the heat-curable layer 106 on the first structure 102, while the second temperature A2 of the second structure 104 is high enough to cure a portion 106b of the heat-curable layer 106 on the second structure 104. In some embodiments, during or after using the laser beam L1 to heat the first structure 102 and the second structure 104, the portion 106b of the heat-curable layer 106 on the second structure 104 is cured and the portion 106a of the heat-curable layer 106 on the first structure 102 remains uncured. In some embodiments, during or after using the laser beam L1 to heat the first structure 102 and the second structure 104, the hardness of portion 106b is greater than the hardness of portion 106a.

In some embodiments, in subsequent processes, the uncured portion 106a is removed to expose the first structure 102, and the cured portion 106b is used as a blocking layer to block the second structure 104. The details will be discussed in the following paragraphs.

In some embodiments, the difference between the second temperature A2 and the first temperature A1 is not less than 100° C. (e.g., the difference between the second temperature A2 and the first temperature A1 is in a range from about 100° C. to about 300° C.). When the difference between the second temperature A2 and the first temperature A1 is too small, it may be hard to control the position of the interface F1 between the cured portion 106b and the uncured portion 106a. In some embodiments, the interface F1 between the cured portion 106b and the uncured portion 106a is controlled to be substantially aligned with the interface F2 between the first structure 104 and the second structure 106, as shown in FIG. 1C. In some embodiments, the interface F1 is slightly laterally spaced apart from the interface F2.

In some embodiments, the wavelength of the laser beam L1 is in a range from about 600 nm to about 1000 nm. When the wavelength of the laser beam L1 is too large or too small, it may be hard to find materials with suitable laser absorption coefficients to form the first structure 102 and the second structure 104.

In some embodiments, the laser beam L1 heats the first structure 102 and the second structure 104 for about 0.01 to about 10 milliseconds. When the heating time is too short, the portion 106b on the second structure 104 may not be sufficiently cured, and thus the portion 106b on the second structure 104 may be undesirably removed in a subsequent process for removing the portion 106a on the first structure 102. On the other hand, when the heating time is too long, the manufacturing cost may be increased.

Figure 1D:
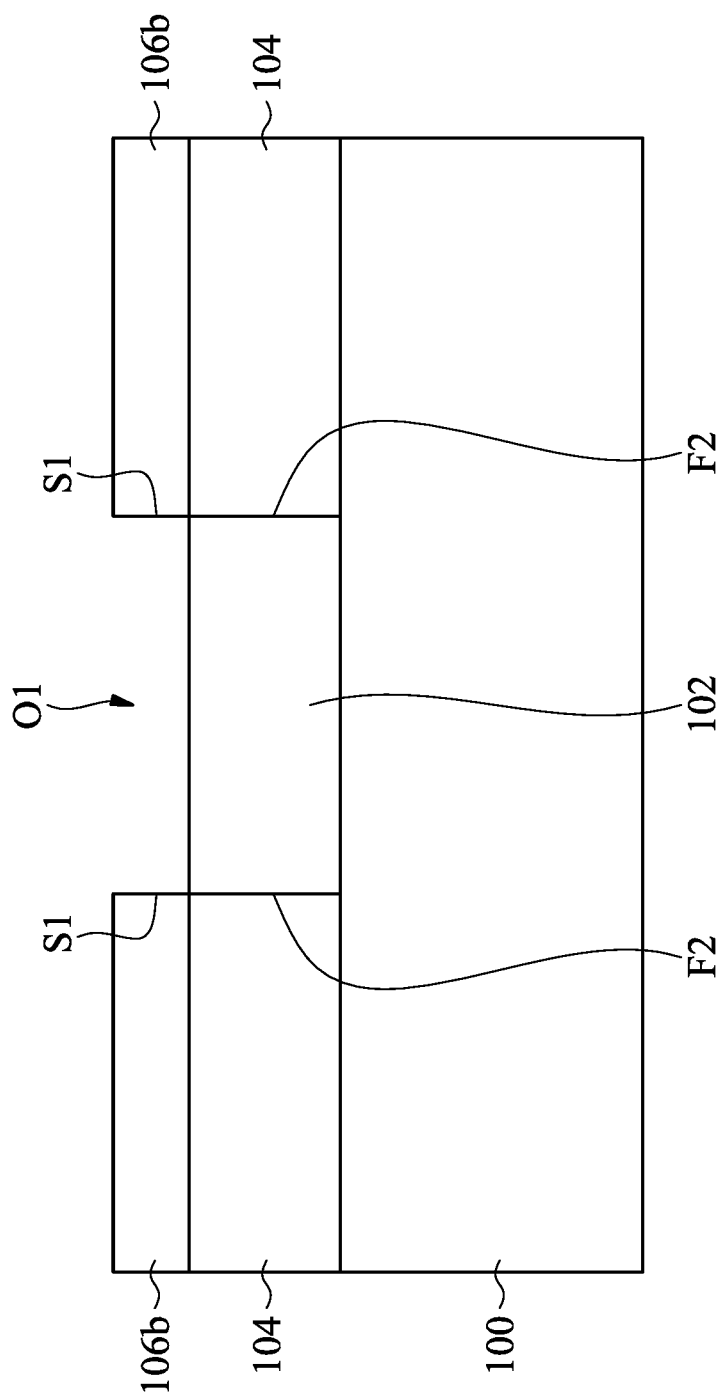

Afterwards, the uncured portion 106a on the first structure 102 is removed, as shown in FIG. 1D in accordance with some embodiments. In some embodiments, an opening O1 is formed to expose the first structure 102 by removing the uncured portion 106a on the first structure 102. In some embodiments, the sidewall S1 of the opening O1 is substantially aligned with the interface F2 between the first structure 102 and the second structure 104. In some embodiments, the sidewall S1 of the opening O1 is slightly laterally spaced apart from the interface F2.

For example, the uncured portion 106a may be removed by an organic solvent (e.g., acetone, ethanol, propylene glycol methyl ether acetate (PGMEA), 2-butanone, another applicable solvent, or a combination thereof). For example, the uncured portion 106a may be removed by plasma (e.g., oxygen plasma, another applicable plasma, or a combination thereof).

Figure 1E:
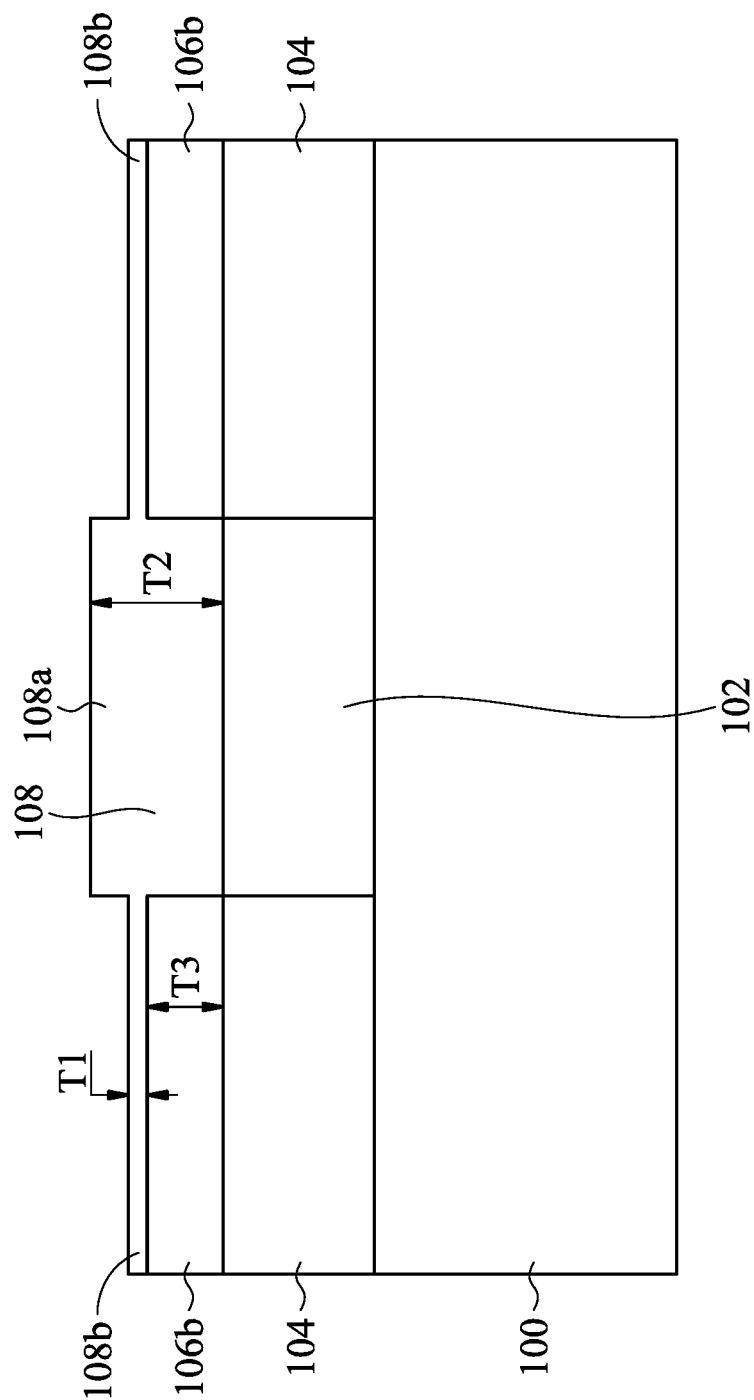
Figure 1E:
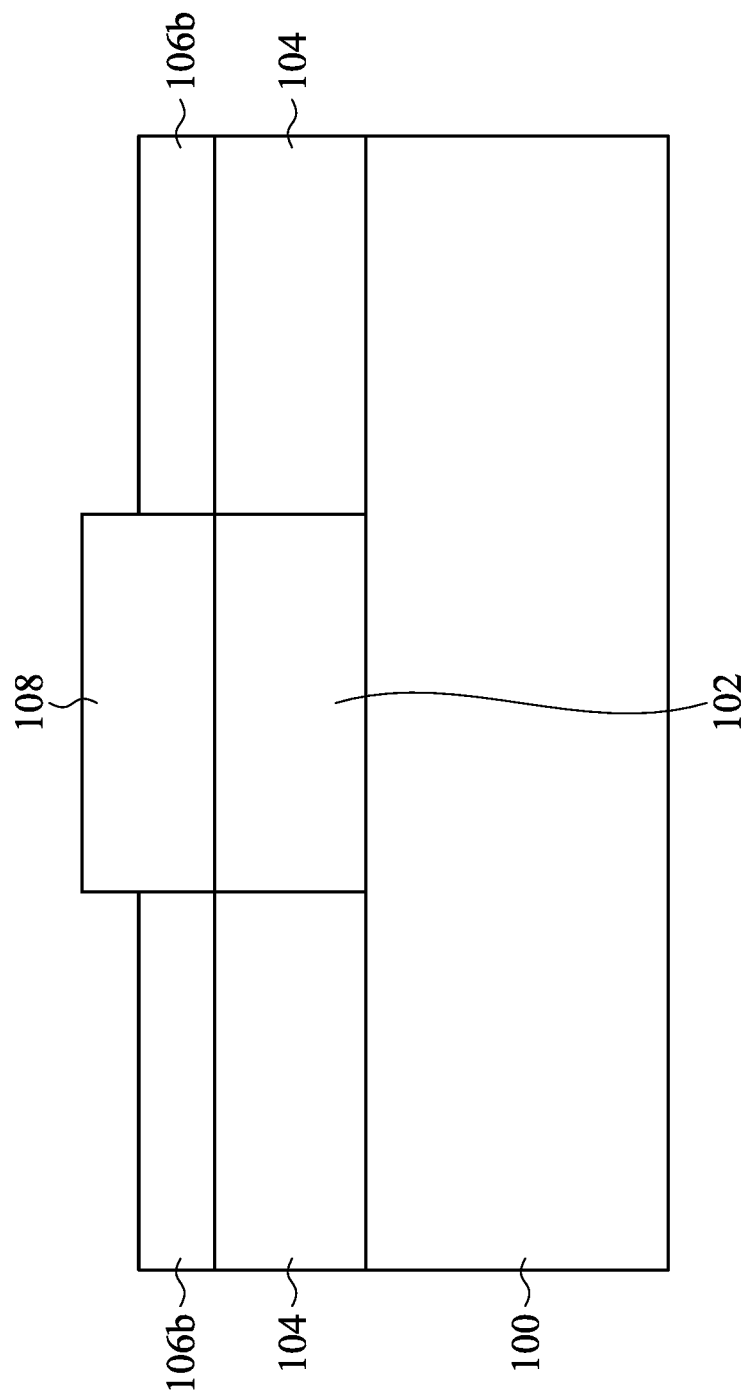

Afterwards, a third material 108 is selectively formed on the first structure 102, as shown in FIGS. 1E and 1E' in accordance with some embodiments.

In some embodiments, a portion 108a of the third material 108 is formed on the first structure 102, and a portion 108b of the third material 108 is formed on the second structure 104, as shown in FIG. 1E. In these embodiments, the third material 108 being selectively formed on the first structure 102 means that the thickness T1 of second portion 108b of the third material 108 on the second structure 104 is much less than the thickness T2 of the first portion 108a of the third material 108 on the first structure 102 (e.g., the ratio of T1 to T2 (i.e., T1/T2) is in a range from about 0.001 to about 0.1). In some embodiments, the third material 108 being selectively formed on the first structure 102 means that the third material 108 is formed on the first structure 102 and no third material 108 is formed on the second structure 104, as shown in FIG. 1E'.

In some embodiments, the cured portion 106b on the second structure 104 serves as a blocking layer to prevent the third material 108 from being formed to be in direct contact with the second structure 104. In some embodiments, the first structure 102 made of the first material has a surface property (e.g., hydrophobicity) which is appropriate for the deposition of the third material 108, and the cured portion 106b has a surface property which is not appropriate for the deposition of the third material 108, so that the third material 108 is selectively deposited on the first structure 102.

In some embodiments, the third material 108 is formed using a deposition process (e.g., a chemical vapor deposition process, a physical vapor deposition process, an atomic layer deposition process, an electroplating deposition process, another applicable deposition process, or a combination thereof). For example, the third material 108 may be a metal (e.g., tungsten, titanium, aluminum, copper, molybdenum, nickel, platinum, another applicable metal, or a combination thereof), a dielectric material (e.g., silicon oxide, silicon nitride, metal oxide, another applicable dielectric material, or a combination thereof), a semiconductor material (e.g., silicon), another applicable material, or a combination thereof.

Figure 1F:
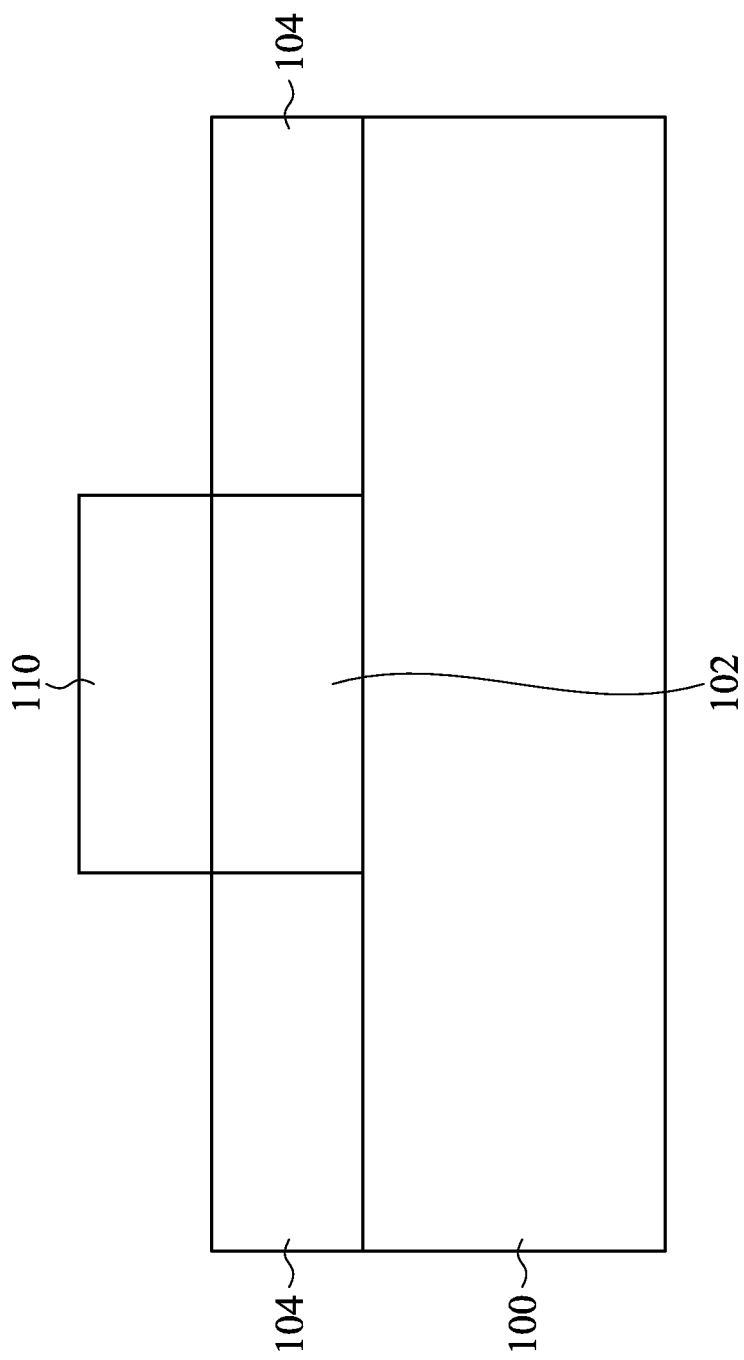

Afterwards, the cured portion 106b is removed from the second structure 104, as shown in FIG. 1F in accordance with some embodiments. The cured portion 106b may be removed by any applicable process. For example, plasma or organic solvent may be used to remove the cured portion 106b. For example, the cured portion 106b may be removed by an ashing process.

The portion 108b of the third material 108 on the cured portion 106b on the second structure 104 is also removed, as shown in FIG. 1F in accordance with some embodiments. In some embodiments, the process for removing the cured portion 106b from the second structure 104 also removes the portion 108b of the third material 108 from the second structure 104. The ratio of the thickness T1 of the portion 108b of the third material 108 to the thickness T3 of the cured portion 106b of the heat-curable layer 106 is not more than 0.1 (e.g., the ratio of the thickness T1 to the thickness T3 (i.e., T1/T3) is in a range from about 0.001 to about 0.1), as shown in FIG. 1E in accordance with some embodiments. When the ratio of the thickness T1 to the thickness T3 is too large, it may be difficult to use a single removal process to remove both the cured portion 106b of the heat-curable layer 106 and the portion 108b of the third material 108, and thus the manufacturing time and/or the manufacturing cost may be increased.

After the cured portion 106b of the heat-curable layer 106 is removed, the third material 108 (or 108a) is left on the first structure 102 to serve as a third structure 110. In some embodiments, the third structure 110 serves as a hard mask to protect the first structure 102 during a subsequent etching process (e.g., an etching process for forming openings in the second structure 104).

Figure 2A:
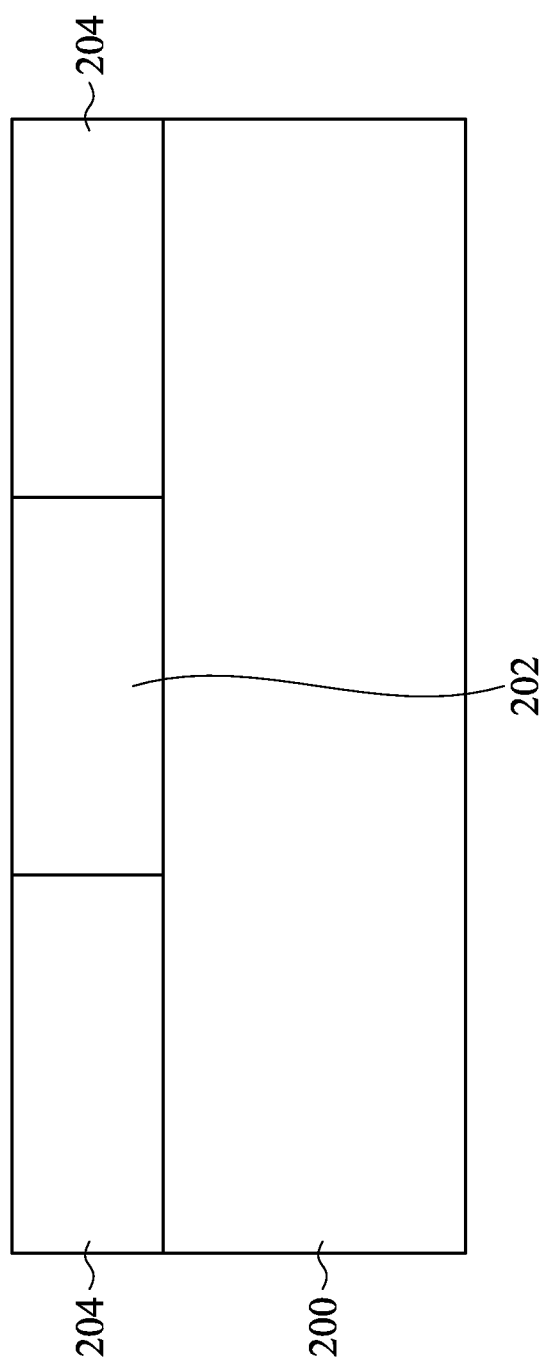
FIGS. 2A and 2B are a series of cross-sectional views illustrating various stages of a method for forming a semiconductor structure in accordance with some embodiments.
Figure 2B:
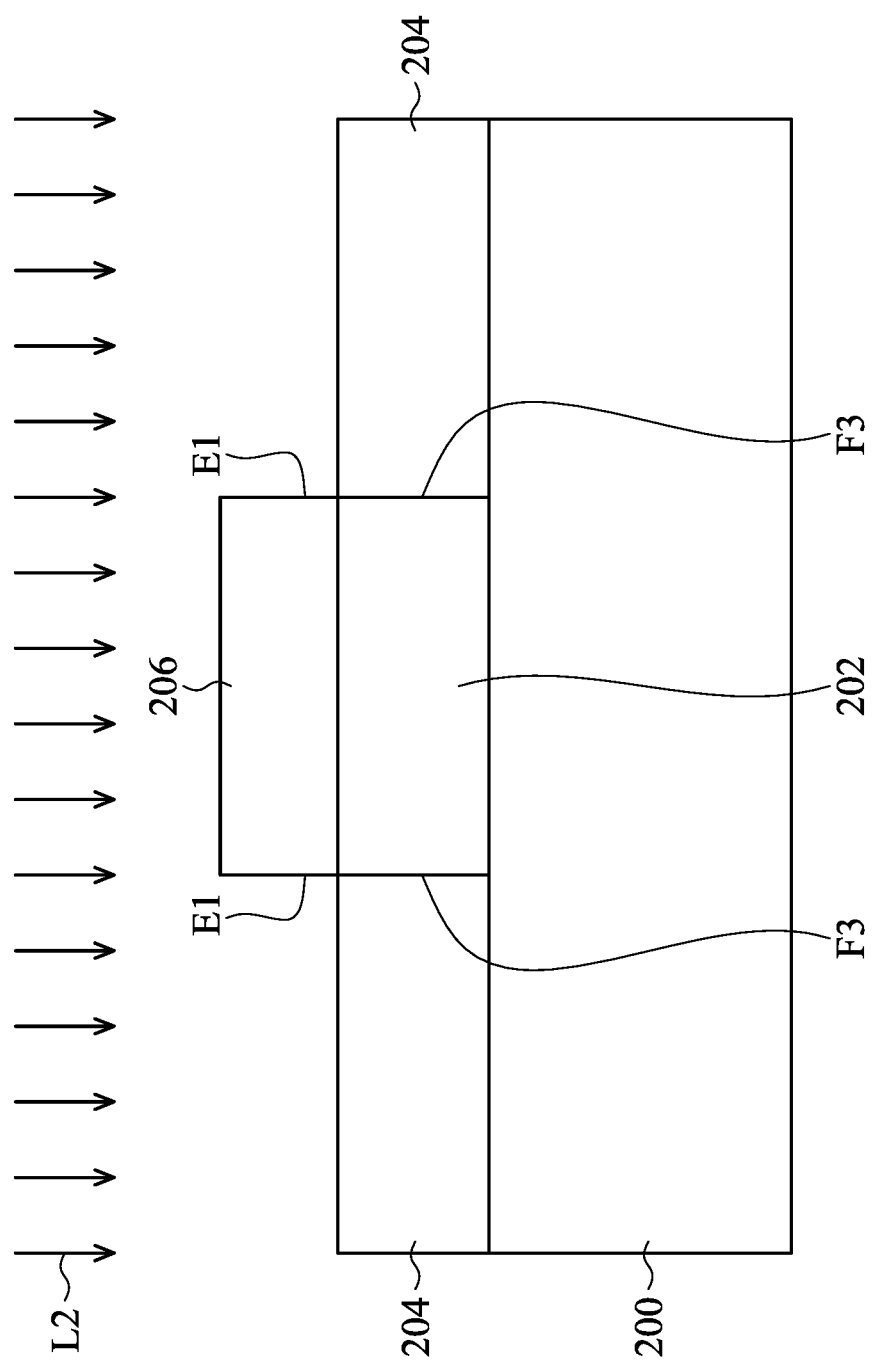
Figure 2B:
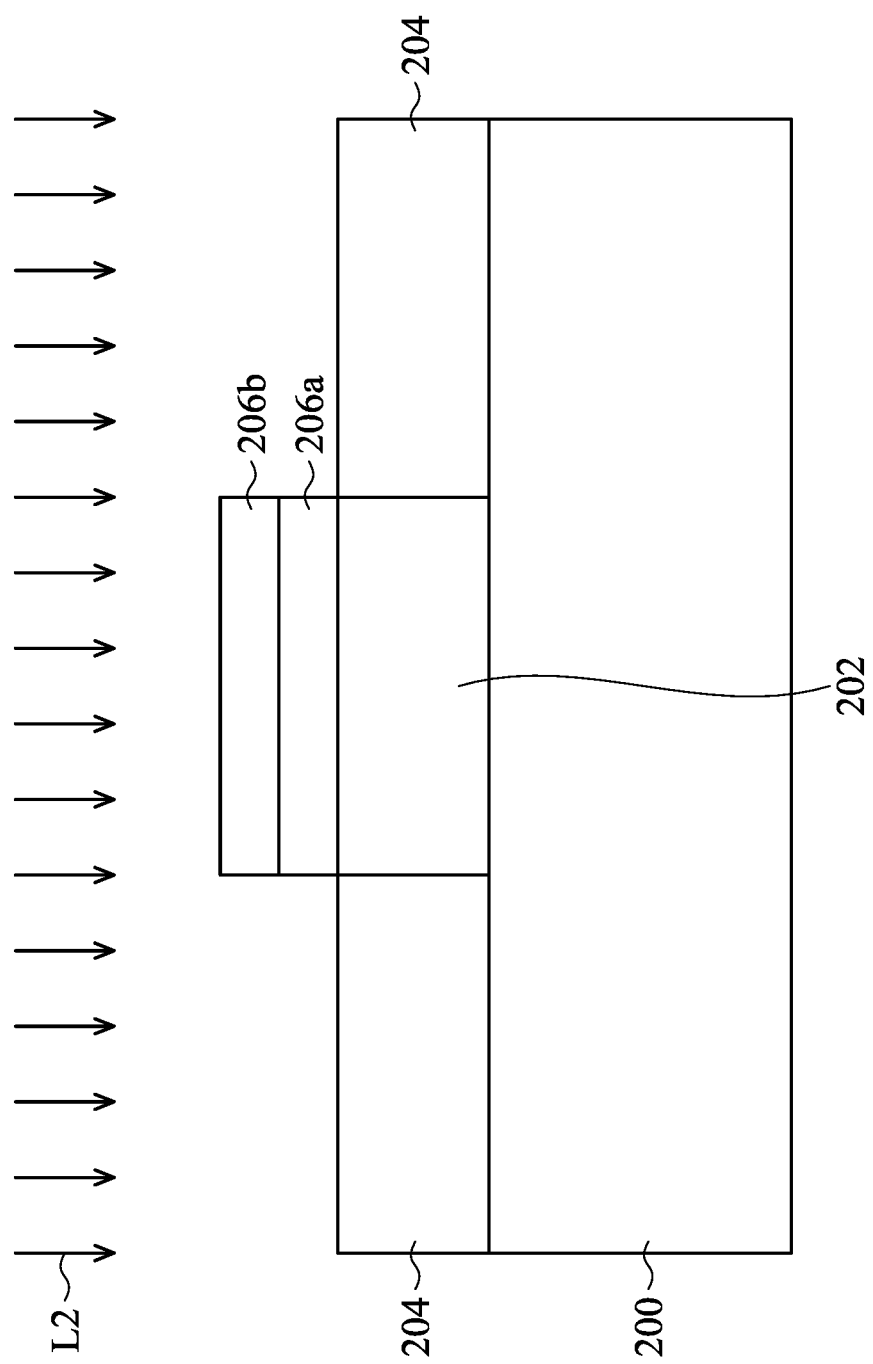

FIGS. 2A and 2B are cross-sectional representations of various stages of a method for forming a semiconductor structure, in accordance with some embodiments of the present disclosure. A fourth structure 202 and a fifth structure 204 are formed on a semiconductor substrate 200, as shown in FIG. 2A in accordance with some embodiments. The materials and methods for forming the semiconductor substrate 200 are the same as or similar to those of the semiconductor substrate 100 of the embodiments illustrated in FIG. 1A. In the interests of simplicity, the details will not be discussed again.

The top surface of the fourth structure 202 is substantially level with the top surface of the fifth structure 204, as shown in FIG. 2A in accordance with some embodiments. In some embodiments, the top surface of the fourth structure 202 and the top surface of the fifth structure 204 are coplanar. In some embodiments, the top surface of the fourth structure 202 is higher or lower than the top surface of the fifth structure 204.

The fourth structure 202 is made of a fourth material, and the fifth structure 204 is made of a fifth material that is different from the fourth material, in accordance with some embodiments.

In some embodiments, the fourth material of the fourth structure 202 is a metal (e.g., tungsten, titanium, aluminum, copper, molybdenum, nickel, platinum, another applicable metal, or a combination thereof), and the fifth material of the fifth structure 204 is a dielectric material (e.g., silicon oxide, silicon nitride, and metal oxide). In some embodiments, the fourth material of the fourth structure 202 is a dielectric material, and the fifth material of the fifth structure 204 is a metal.

In some embodiments, either the fourth material of the fourth structure 202 or the fifth material of the fifth structure 204 is a semiconductor material (e.g., silicon), and the other, either the fourth material or the fifth material, is a dielectric material (e.g., silicon oxide, silicon nitride, and metal oxide). In some embodiments, either the fourth material of the fourth structure 202 or the fifth material of the fifth structure 204 is a metal, and the other, either the fourth material or the fifth material, is a semiconductor material.

The fifth structure 204 is an interlayer dielectric layer, and the fourth structure 202 is a gate structure disposed in the interlayer dielectric layer, in accordance with some embodiments. In some embodiments, the fifth structure 204 is an interlayer dielectric layer, and the fourth structure 202 is a contact structure (e.g., a source/drain contact structure) disposed in the interlayer dielectric layer. For example, the fourth structure 202 and the fifth structure 204 may be formed by a chemical vapor deposition process, a spin-on coating process, a physical vapor deposition process, another applicable process, or a combination thereof.

Afterwards, a sixth material 206 is selectively formed on the fourth structure 202, as shown in FIG. 2B in accordance with some embodiments. In some embodiments, process (e.g., an etching process for forming openings in the fifth structure 204). In some embodiments, the sixth material 206 being selectively formed on the fourth structure 202 means that the sixth material 206 is formed on the fourth structure 202 and no sixth material 206 is formed on the fifth structure 204, as shown in FIG. 2B. In some embodiments, the sixth material 206 being selectively formed on the fourth structure 202 means that the thickness of the sixth material 206 on the fifth structure 204 is much less than the thickness of the sixth material 206 on the fourth structure 202 (e.g., the ratio of the thickness of the sixth material 206 on the fifth structure 204 to the thickness of the sixth material 206 on the fourth structure 202 is in a range from about 0.001 to about 0.1). In some embodiments, the sixth material 206 on the fifth structure 204 is removed from the fifth structure 204 by an etching process.

For example, the sixth material 206 may be a metal (e.g., tungsten, titanium, aluminum, copper, molybdenum, nickel, platinum, another applicable metal, or a combination thereof), a dielectric material (e.g., silicon oxide, silicon nitride, metal oxide, another applicable dielectric material, or a combination thereof), a semiconductor material (e.g., silicon), another applicable material, or a combination thereof.

The sixth material 206 is formed by a deposition process, in accordance with some embodiments. In some embodiments, the sixth material 206 is formed by an atomic layer deposition process. The deposition process for forming the sixth material 206 may be performed in a deposition chamber. The fourth structure 202 and the fifth structure 204 are heated by a laser beam L2 before and/or during the deposition process (e.g., an atomic layer deposition process) for forming the sixth material 206, as shown in FIG. 2B in accordance with some embodiments.

The laser absorption coefficient C4 of the fourth material of the fourth structure 202 with respect to the laser beam L2 is higher than the laser absorption coefficient C5 of the fifth material of the fifth structure 204 with respect to the laser beam L2, in accordance with some embodiments. In some embodiments, the laser absorption coefficient C4 is higher than the laser absorption coefficient C5, so that the fifth structure 204 is heated by the laser beam L2 to a fifth temperature A5 and the fourth structure 202 is heated by the laser beam L2 to a fourth temperature A4 which is higher than the fifth temperature A5 before and/or during the deposition process for forming the sixth material 206. In some embodiments, since the fourth temperature A4 is higher than the fifth temperature A5, the sixth material 206 is selectively formed on the fourth structure 202 using the deposition process for forming the sixth material 206.

In some embodiments, the sixth material 206 is formed using an atomic layer deposition process, the fourth temperature A4 (e.g., in a range from about 200° C. to about 600° C.) is appropriate for the atomic layer deposition process for forming the sixth material 206, while the fifth temperature A5 is too low to be appropriate for the atomic layer deposition process for forming the sixth material 206. Therefore, in these embodiments, the sixth material 206 is selectively formed on the fourth structure 202 by the atomic layer deposition process. In some embodiments, since the fourth temperature A4 is appropriate for the atomic layer deposition process for forming the sixth material 206, the quality of the sixth material 206 on the fourth structure 202 can be improved (e.g., the defects may be reduced).

In some embodiments, the atomic layer deposition process for forming the sixth material 206 includes selectively depositing a first precursor 206a on the fourth structure 202 in a deposition chamber, and then selectively depositing a second precursor 206b on the fourth structure 202 in the deposition chamber, as shown in FIG. 2B' in accordance with some embodiments. The second precursor 206b is reacted with the first precursor 206a to form the sixth material 206, in accordance with some embodiments.

The first precursor 206a and the second precursor 206b may be selected according to the sixth material 206 intended to be formed. For example, when the sixth material 206 is silicon nitride, the first precursor 206a may include $SiCl_4$, $SiH_2Cl_2$, another applicable material, or a combination thereof, and the second precursor 206b may include $NH_3$, another applicable material, or a combination thereof. For example, when the sixth material 206 is tungsten, the first precursor 206a may be $WF_6$, and the second precursor 206b may be $Si_2H_6$.

In some embodiments, the fourth temperature A4 (e.g., in a range from about 200° C. to about 600° C.) is appropriate for the atomic layer deposition of the first precursor 206a, and the fifth temperature A5 is too low to be appropriate for the atomic layer deposition of the first precursor 206a, so that the first precursor 206a is selectively deposited on the fourth structure 202.

In some embodiments, the fourth temperature A4 (e.g., in a range from about 200° C. to about 600° C.) is appropriate for the atomic layer deposition of the second precursor 206b, and the fifth temperature A5 is too low to be appropriate for the atomic layer deposition of the second precursor 206b, so that the second precursor 206b is selectively deposited on the first precursor 206a on the fourth structure 202.

In some embodiments, the surface property (e.g., the hydrophobicity) of the first precursor 206a on the fourth structure 202 is appropriate for the deposition (e.g., atomic layer deposition) of the second precursor 206b, and the surface property of the fifth structure 204 is not appropriate for the deposition of the second precursor 206b, so that the second precursor 206b is selectively deposited on the first precursor 206a on the fourth structure 202. Therefore, in these embodiments, it may not be necessary to heat the fourth structure 202 and the fifth structure 204 by the laser beam L2 during the deposition of the second precursor 206b, since the second precursor 206b may be selectively deposited on the first precursor 206a due to different surface properties between the first precursor 206a and the fifth structure 204.

In some embodiments, the difference between the fourth temperature A4 and the fifth temperature A5 is not less than 100° C. (e.g., the difference between the fourth temperature A4 and the fifth temperature A5 is in a range from about 100° C. to about 300° C.). When the difference between the fourth temperature A4 and the fifth temperature A5 is too small, it may be hard to control the position of the edge (or sidewall) E1 of the third material 206. In some embodiments, the edge (or sidewall) E1 of the third material 206 is controlled to be substantially aligned with the interface F3 between the fourth structure 202 and the fifth structure 204, as shown in FIG. 2B. In some embodiments, the edge (or sidewall) E1 is slightly laterally spaced apart from the interface F3.

In some embodiments, the wavelength of the laser beam L2 is in a range from about 600 nm to about 1000 nm. When the wavelength of the laser beam L2 is too large or too small, it may be hard to find materials with suitable laser absorption coefficients to form the fourth structure 202 and the fifth structure 204.

In some embodiments, the laser beam L2 heats the fourth structure 202 and the fifth structure 204 for about 0.01 to about 10 milliseconds. When the heating time is too long, the quality of the fourth structure 202 and the fifth structure 204 may be degraded. On the other hand, when the heating time is too short, the deposition behavior of the sixth material 206 may not be sufficiently affected.

Figure 4A:
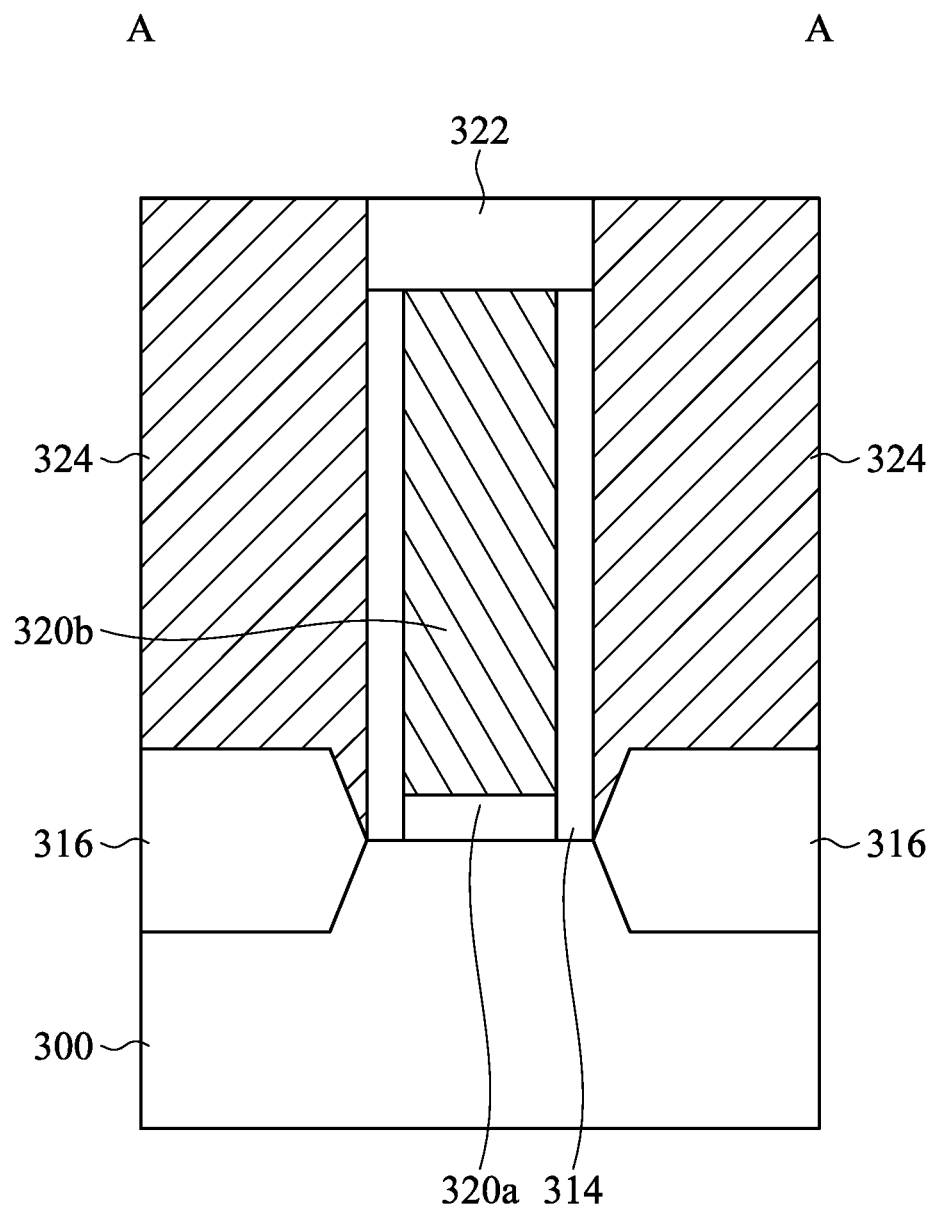
FIGS. 4A and 4B are a series of cross-sectional views which are taken along the cut line A-A of FIG. 3G and illustrate various stages of a method for forming a semiconductor structure in accordance with some embodiments.
Figure 4B:
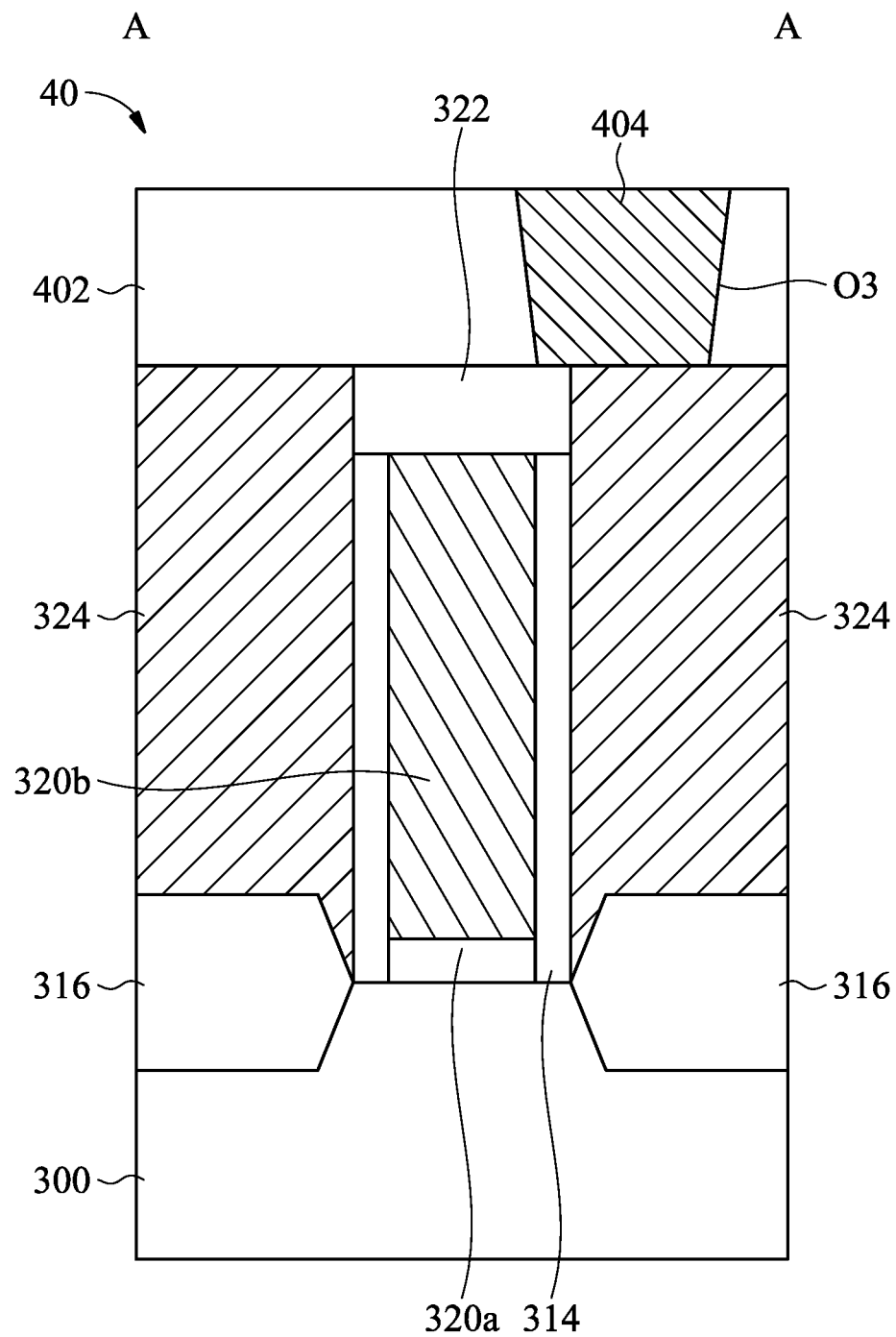
Figure 5A:
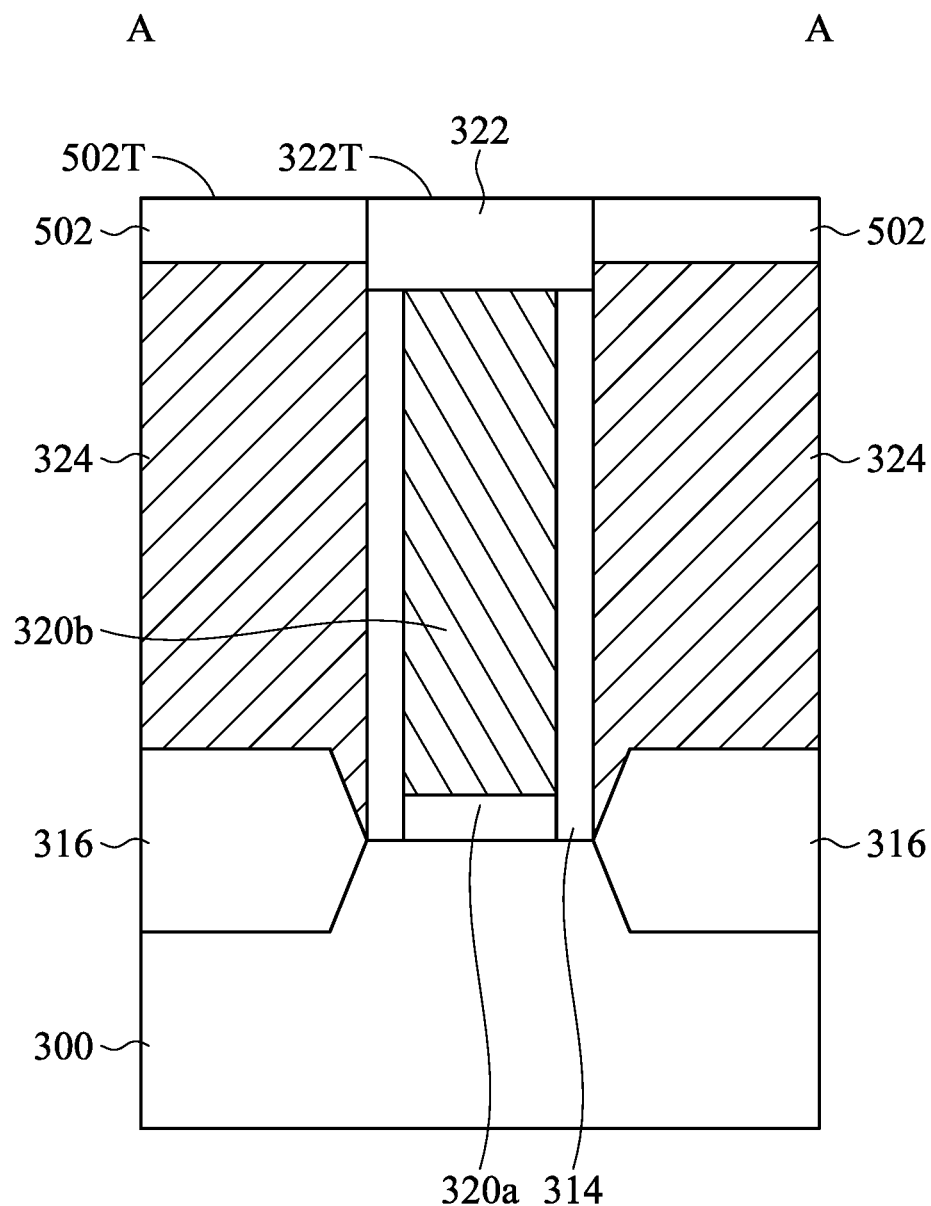
FIGS. 5A and 5B are a series of cross-sectional views which are taken along the cut line A-A of FIG. 3G and illustrate various stages of a method for forming a semiconductor structure in accordance with some embodiments.
Figure 5B:
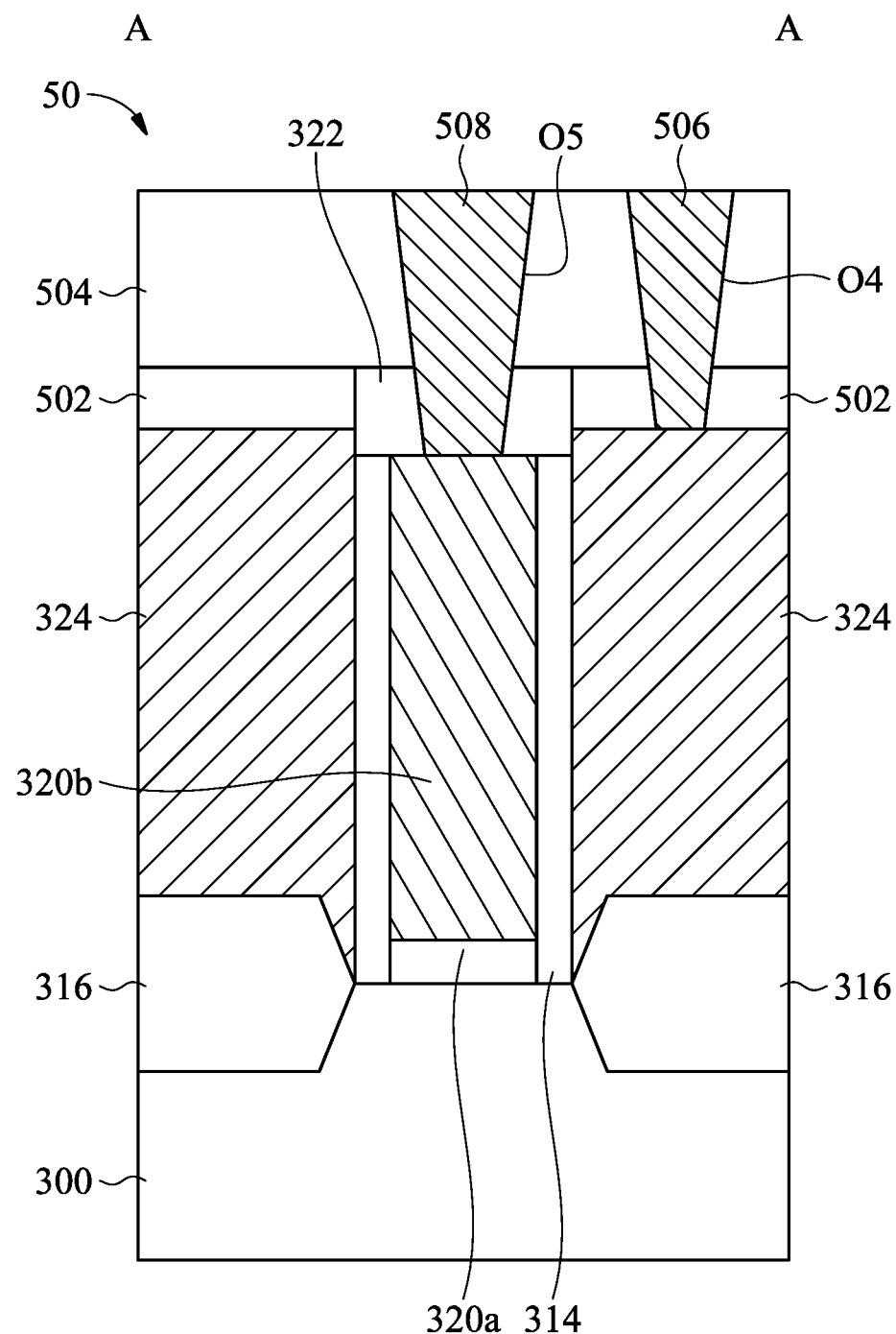

FIGS. 3A to 3G are perspective representations of various stages of a method for forming a semiconductor structure, in accordance with some embodiments of the disclosure. FIG. 4A is a cross-sectional representation taken along the cut line A-A of FIG. 3G. FIG. 4B is a cross-sectional representation which illustrates a stage following the stage illustrated in FIG. 4A of a method for forming a semiconductor structure, in accordance with some embodiments. FIGS. 5A and 5B are cross-sectional representations which illustrate various stages following the stage illustrated in FIG. 4A of a method for forming a semiconductor structure, in accordance with some embodiments.

Figure 3A:
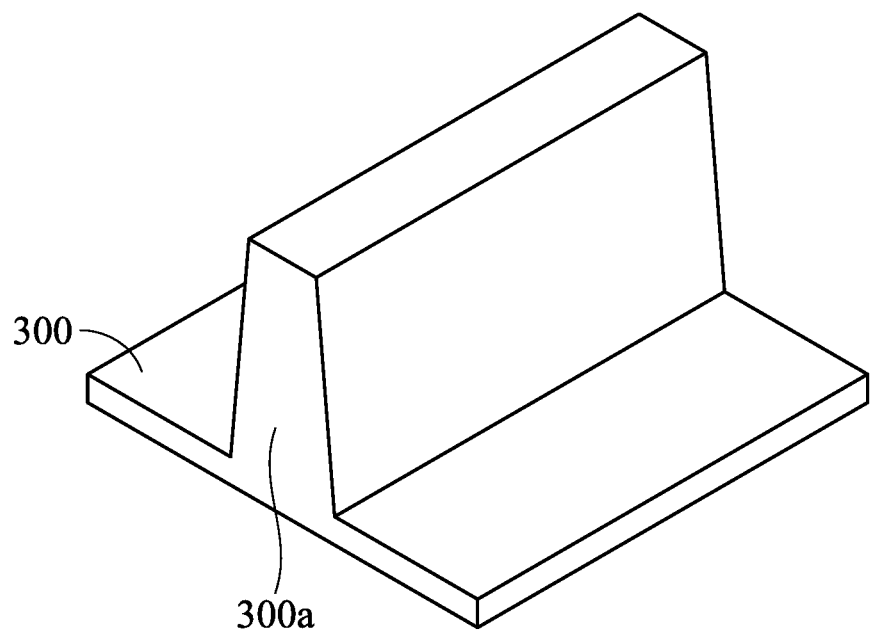
FIGS. 3A, 3B, 3C, 3D, 3E, 3F, and 3G are a series of perspective views illustrating various stages of a method for forming a semiconductor structure in accordance with some embodiments.

A semiconductor substrate 300 is provided, as shown in FIG. 3A in accordance with some embodiments. The semiconductor substrate 300 may be the same as or similar to the semiconductor substrate 100 of the above embodiments. In the interest of simplicity, the details will not be discussed again.

Afterwards, a fin structure 300a is formed on the semiconductor substrate 300, as shown in FIG. 3A in accordance with some embodiments. The fin structure 300a may be formed by patterning the semiconductor substrate 300 using a lithography process, an etching process, another applicable process, or a combination thereof. In some embodiments, the fin structure 300a has a width that gradually increases from the top portion to the lower portion, as shown in FIG. 3A.

Figure 3B:
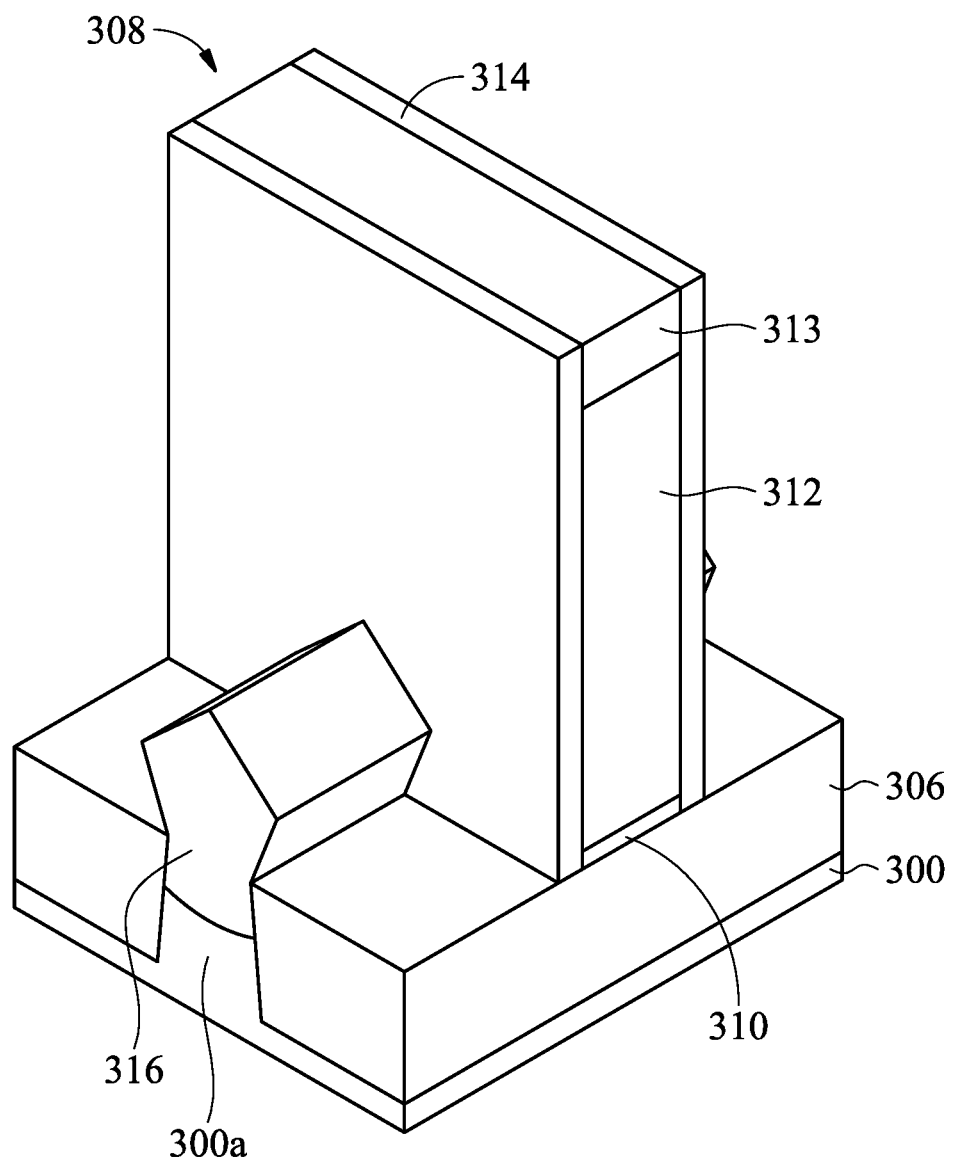

After the fin structure 300a is formed, an isolation structure 306 is formed over the substrate 300, and the fin structure 300a is surrounded by the isolation structure 306, as shown in FIG. 3B in accordance with some embodiments.

The isolation structure 306 may be formed by depositing an insulating layer over the substrate 300 and recessing the insulating layer. In some embodiments, the isolation structure 306 is made of silicon oxide, silicon nitride, silicon oxynitride, fluoride-doped silicate glass (FSG), other applicable dielectric materials, or a combination thereof.

Afterwards, a dummy gate structure 308 is formed across the fin structure 300a and extends over the isolation structure 306, as shown in FIG. 3B in accordance with some embodiments. The dummy gate structure 308 may include a dummy gate dielectric layer 310, a dummy gate electrode layer 312, and a capping layer 313.

The dummy gate dielectric layer 310 may be made of silicon oxide, other applicable dielectric materials, or a combination thereof. The dummy gate electrode layer 312 may be made of poly-silicon, or other applicable materials. The capping layer 313 may be made of silicon nitride, or other applicable materials. The dummy gate dielectric layer 310, the dummy gate electrode layer 312, and the capping layer 313 may be formed by suitable deposition processes (e.g., chemical vapor deposition process, and physical vapor deposition process).

After the dummy gate structure 308 is formed, spacers 314 are formed on sidewalls of the dummy gate structure 308, as shown in FIG. 3B in accordance with some embodiments. In some embodiments, the spacers 314 are made of silicon nitride, silicon oxide, other applicable materials, or a combination thereof. In some embodiments, the spacers 314 are formed by a deposition process (e.g., a chemical vapor deposition process) followed by an anisotropic etching process.

Afterwards, source/drain (S/D) structures 316 are formed over and/or in the fin structure 300a, as shown in FIG. 3B in accordance with some embodiments. In some embodiments, portions of the fin structure 300a adjacent to the dummy gate structure 308 are recessed to form recesses, and a strained material is grown in the recesses by an epitaxial (epi) process to form the S/D structures 316. In addition, the lattice constant of the strained material may be different from the lattice constant of the semiconductor substrate 300. In some embodiments, the S/D structures 316 include Si, Ge, SiGe, InAs, InGaAs, InSb, GaAs, GaSb, InAlP, InP, other applicable materials, or a combination thereof.

Figure 3C:
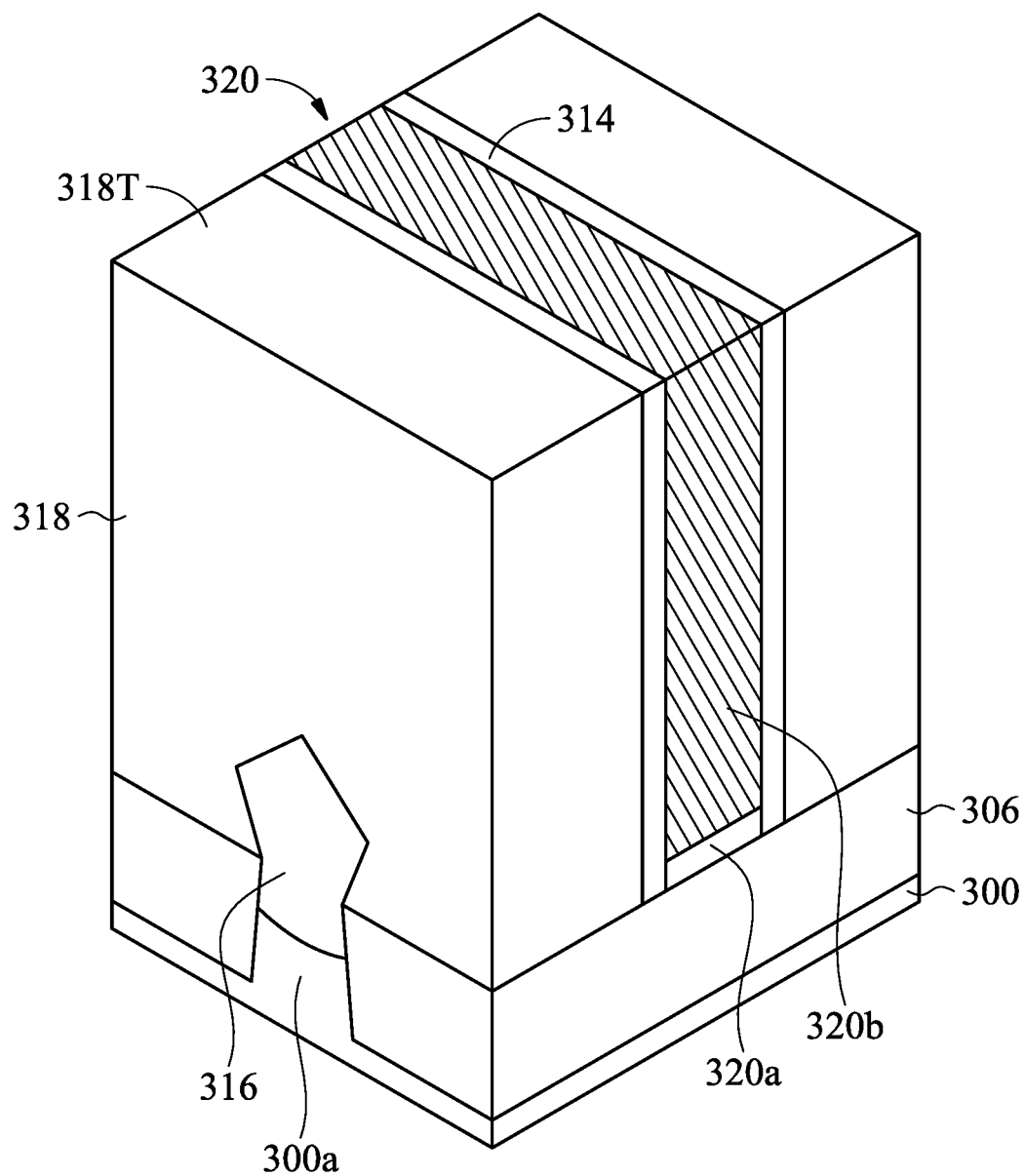

After the source/drain structures 316 are formed, an interlayer dielectric (ILD) layer 318 is formed over semiconductor substrate 300 and the fin structure 300a, as shown in FIG. 3C in accordance with some embodiments. The materials and methods for forming the ILD layer 318 may be the same as or similar to those of the second structure 104 discussed above, and the details will not be discussed again.

Afterwards, the dummy gate structure 308 is replaced by a metal gate structure 320, as shown in FIG. 3C in accordance with some embodiments. In some embodiments, the metal gate structure 320 includes a gate dielectric layer 320a, a work function metal layer (not shown in the figures) on the gate dielectric layer 320a, and a gate electrode layer 320b on the work function metal layer on the gate dielectric layer 320a.

In some embodiments, the gate dielectric layer 320a is made of high-k dielectric materials, such as metal oxides, metal nitrides, metal silicates, transition metal-oxides, transition metal-nitrides, transition metal-silicates, or oxynitrides of metals. Examples of the high-k dielectric material include, but are not limited to, hafnium oxide ($HfO_2$), hafnium silicon oxide (HfSiO), hafnium silicon oxynitride (HfSiON), hafnium tantalum oxide (HfTaO), hafnium titanium oxide (HfTiO), hafnium zirconium oxide (HfZrO), zirconium oxide, titanium oxide, aluminum oxide, hafnium dioxide-alumina ($HfO_2$—$Al_2O_3$) alloy, or other applicable dielectric materials. For example, the gate dielectric layer may be formed by a chemical vapor deposition process, an atomic layer deposition process, other applicable processes, or a combination thereof.

The work function metal layer may be made of tungsten (W), copper (Cu), titanium (Ti), silver (Ag), aluminum (Al), titanium aluminum alloy (TiAl), titanium aluminum nitride (TiAlN), tantalum carbide (TaC), tantalum carbon nitride (TaCN), tantalum silicon nitride (TaSiN), manganese (Mn), zirconium (Zr), titanium nitride (TiN), tungsten nitride (WN), tantalum nitride (TaN), ruthenium (Ru), other applicable materials or a combination thereof. For example, the work function metal layer may be formed by a physical vapor deposition process or another applicable deposition process.

The gate electrode layer 320b may be made of tungsten, titanium, aluminum, copper, molybdenum, nickel, platinum, another applicable conductive material, or a combination thereof. For example, the gate electrode layer may be formed by a physical vapor deposition process or another applicable deposition process.

Figure 3D:
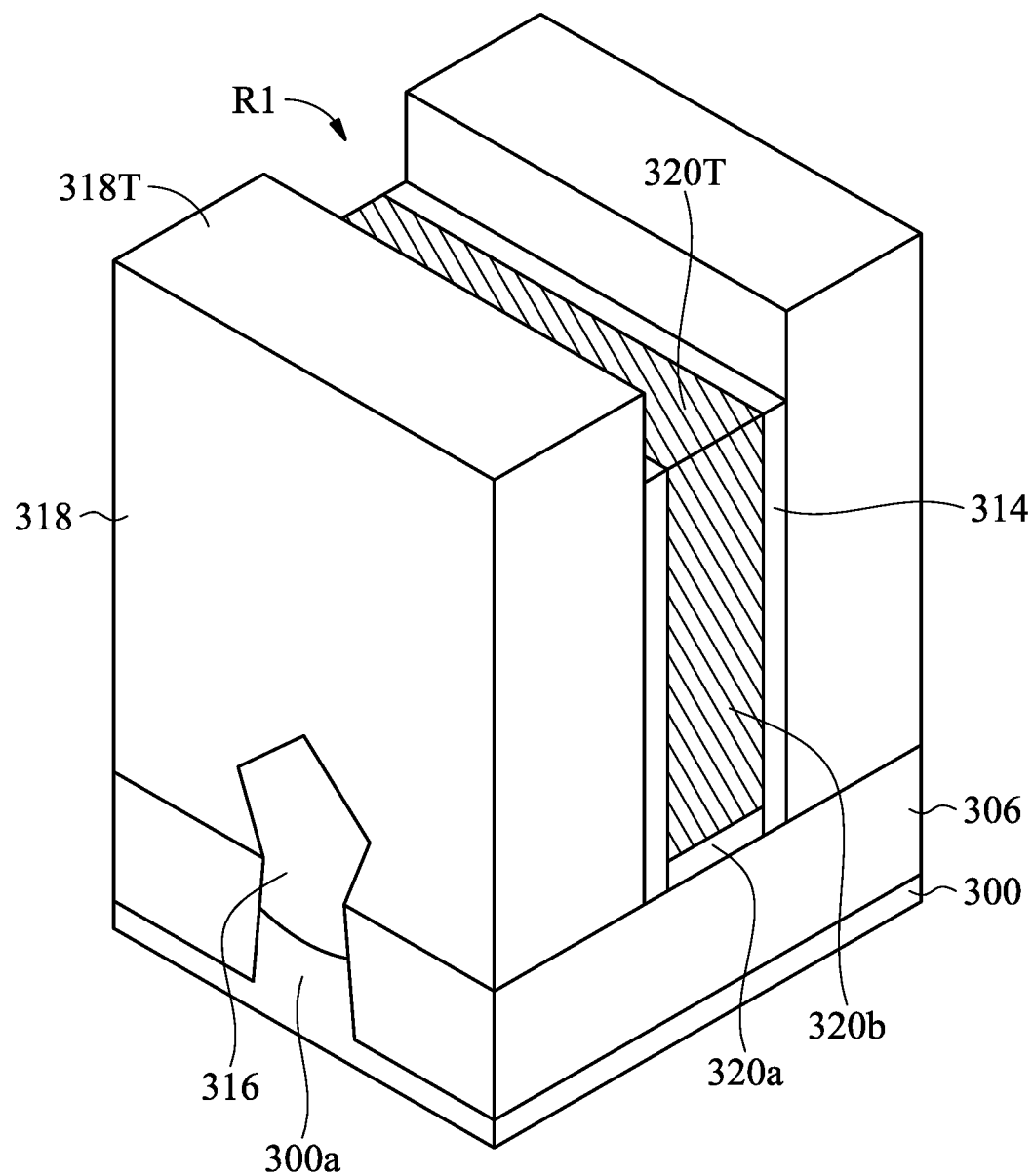

Afterwards, the metal gate structure 320 is recessed to form a recess (or trench) R1 in the ILD layer 318, as shown in FIG. 3D in accordance with some embodiments. In some embodiments, the top surface 320T of the metal gate structure 320 is lower than the top surface 318T of the interlayer dielectric layer 318 after the recess R1 is formed. For example, an etching process (e.g., a dry etching process, a wet etching process, or a combination thereof) may be used to remove an upper portion of the gate electrode layer 320b to form the recess R1. In some embodiments, the etching process for forming the recess R1 also removes upper portions of the spacers 314, as shown in FIG. 3D.

Figure 3E:
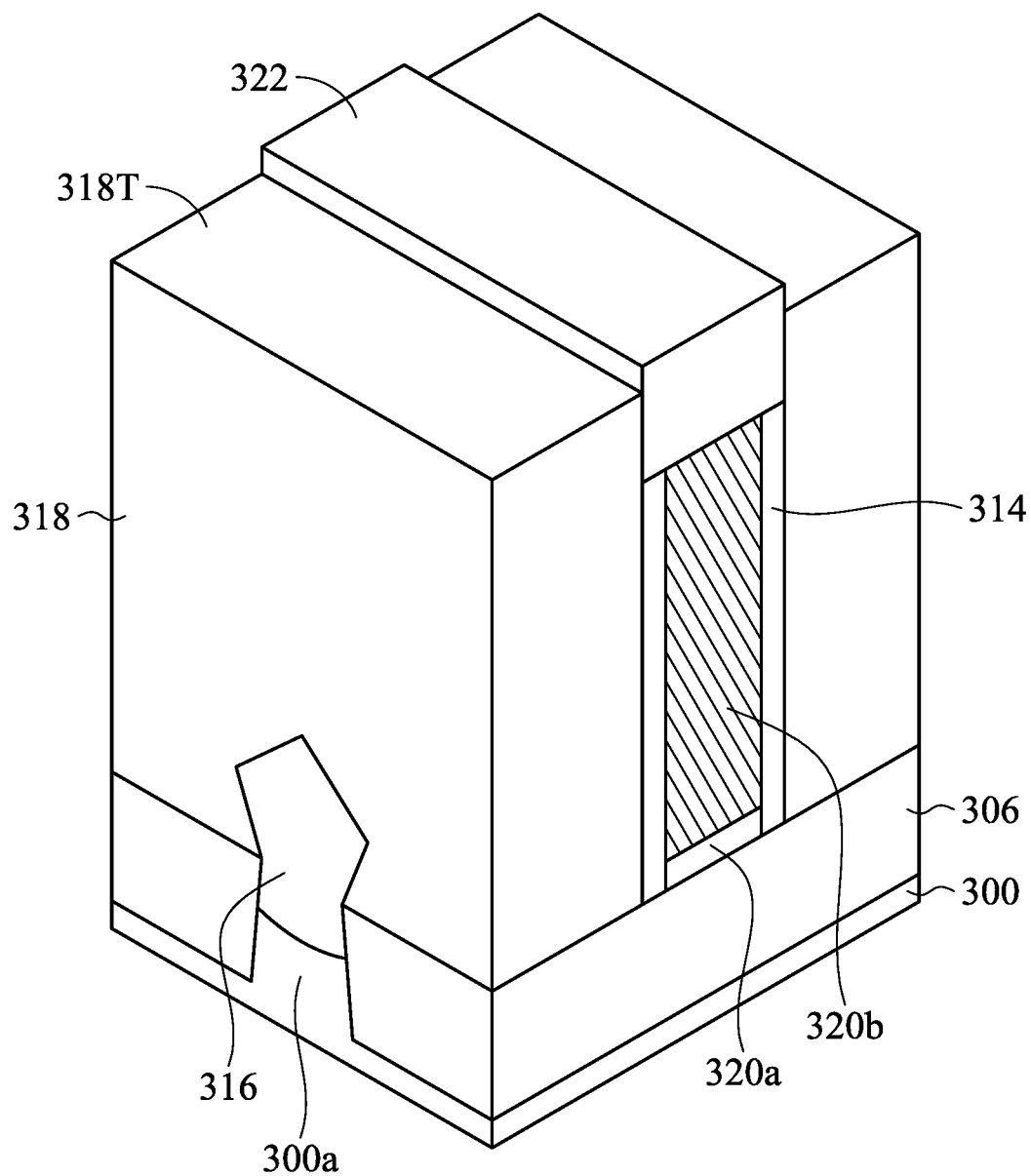

Afterwards, a hard mask 322 is selectively formed on the gate electrode layer 320b of the metal gate structure 320, as shown in FIG. 3E in accordance with some embodiments. In some embodiments, the top surface of the hard mask 322 is higher than the top surface 318T of the interlayer dielectric layer 318.

In some embodiments, the interlayer dielectric layer 318 is similar to the second structure 104 of the above embodiments, the gate electrode layer 320b of the metal gate structure 320 is similar to the first structure 102 of the above embodiments, and the hard mask 322 is similar to the third structure 110 of the above embodiments. Therefore, in these embodiments, the method for forming the hard mask 322 can include forming the heat-curable layer 106 on the interlayer dielectric layer 318 and on the gate electrode layer 320b of the metal gate structure 320, using the laser beam L1 to heat the interlayer dielectric layer 318 and the gate electrode layer 320b of the metal gate structure 320, removing the uncured portion of the heat-curable layer 106 on the gate electrode layer 320b of the metal gate structure 320, selectively depositing the third material 108 on the gate electrode layer 320b of the metal gate structure 320, and removing the cured portion of the heat-curable layer 106 on the interlayer dielectric layer 318 while leaving the third material 108 on the gate electrode layer 320b of the metal gate structure 320 to serve as the hard mask 322.

In some embodiments, the interlayer dielectric layer 318 is similar to the fifth structure 204 of the above embodiments, the gate electrode layer 320b of the metal gate structure 320 is similar to the fourth structure 202 of the above embodiments, and the hard mask 322 can be made of the sixth material 206 of the above embodiments. Therefore, in these embodiments, the method for forming the hard mask 322 can include heating the interlayer dielectric layer 318 and the gate electrode layer 320b of the metal gate structure 320 using the laser beam L2, and selectively depositing the sixth material 206 on the gate electrode layer 320b of the metal gate structure 320 to serve as the hard mask 322.

Figure 3F:
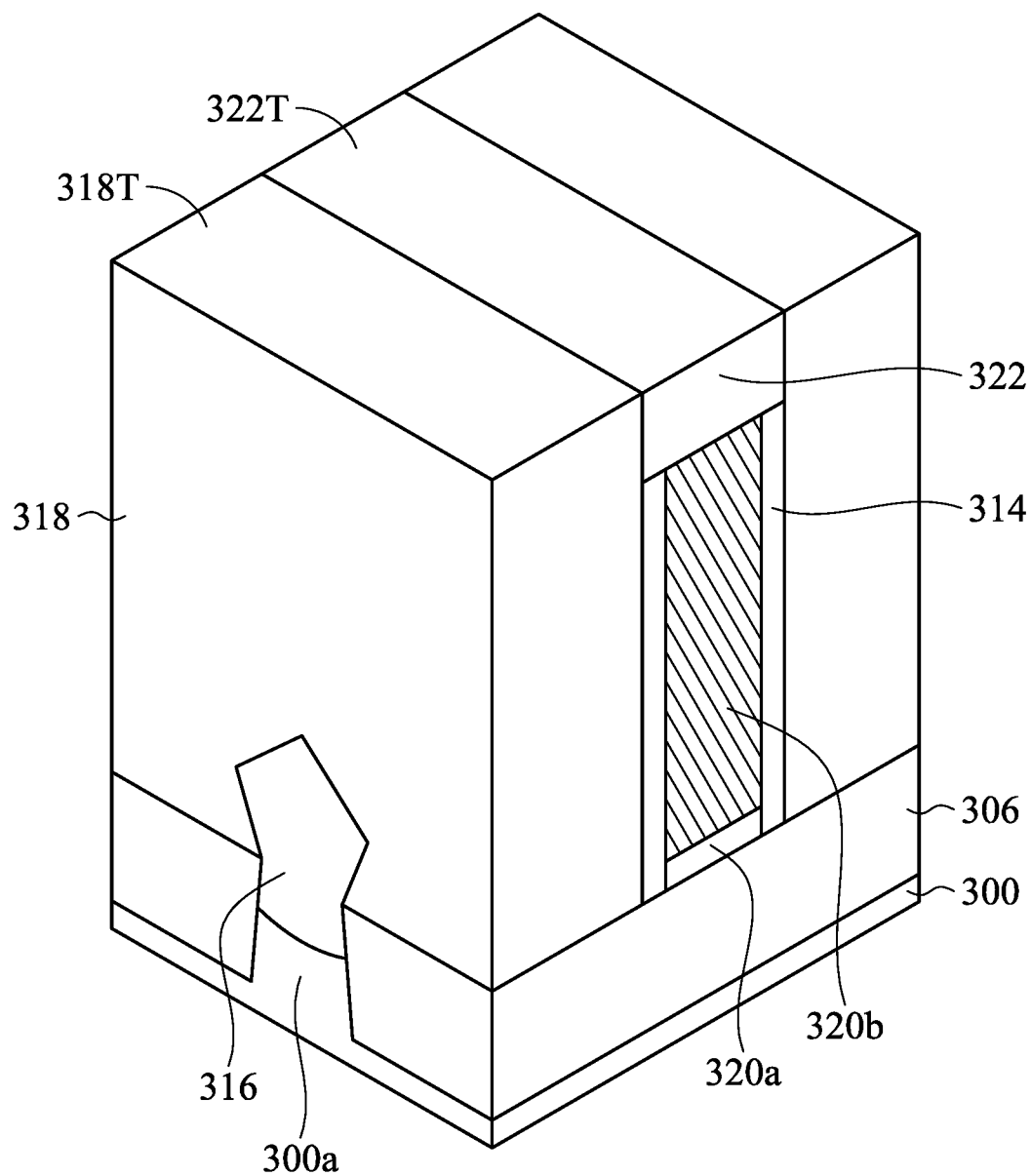

Afterwards, a planarization process (e.g., a chemical mechanical polishing process or an etch back process) is performed on the hard mask 322, as shown in FIG. 3F in accordance with some embodiments. In some embodiments, the top surface 322T of the hard mask 322 is substantially level with the top surface 318T of the interlayer dielectric layer 318 after the planarization process. In some embodiments, the top surface 322T of the hard mask 322 and the top surface 318T of the interlayer dielectric layer 318 are coplanar. In some embodiments, since the hard mask 322 is selectively formed on the gate electrode layer 320b of the metal gate structure 320, the loading of the planarization process may be reduced, which may in turn reduce the manufacturing time and manufacturing cost.

Figure 3G:
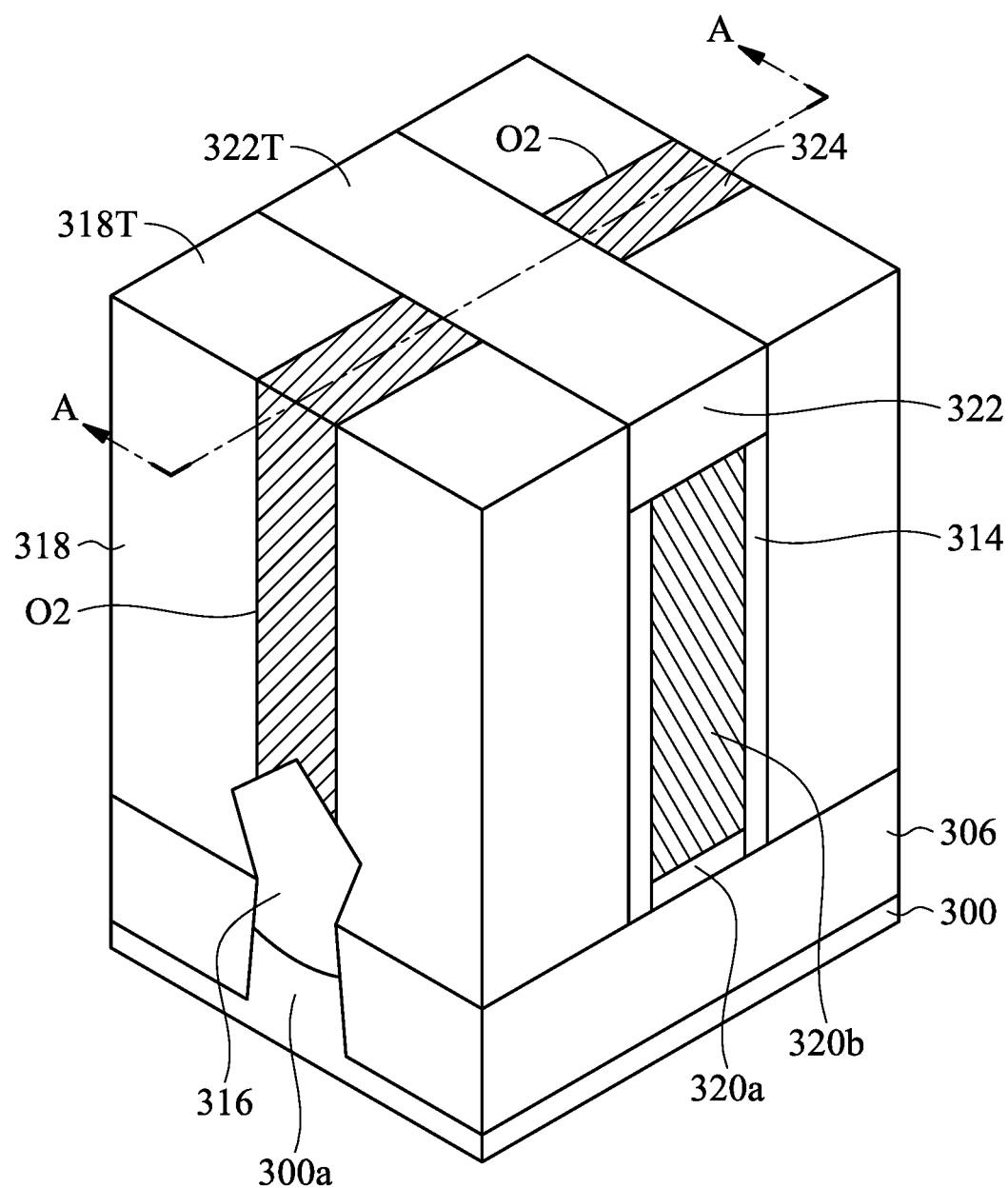

Afterwards, contact holes O2 are formed in the ILD layer 318, and source/drain (S/D) contact structures 324 are formed in the contact holes O2, as shown in FIGS. 3G and 4A in accordance with some embodiments. The contact holes O2 may be formed by a lithography process followed by an etching process. The hard mask 322 and the ILD layer 318 may be made of different materials. The etching selectivity of the hard mask 322 with respect to the ILD layer 318 may be high enough. Therefore, the etching process for forming the contact holes O2 is a self-aligned etching process, in accordance with some embodiments. The contact holes O2 may be filled with applicable conductive materials to form the S/D contact structures 324 using a physical vapor deposition process, an atomic layer deposition process, a plating process, a chemical vapor deposition process, another applicable process, or a combination thereof. For example, the S/D contact structures 324 may be made of tungsten, cobalt, titanium, aluminum, copper, tantalum, platinum, molybdenum, silver, manganese, zirconium, ruthenium, another applicable conductive material, or a combination thereof.

Afterwards, a dielectric layer 402 is formed on the S/D contact structures 324, the hard mask 322, as shown in FIG. 4B in accordance with some embodiments. In some embodiments, the dielectric layer 402 is formed on the interlayer dielectric layer 318, and the methods and materials of forming the dielectric layer 402 may be the same as or similar to those of the interlayer dielectric layer 318.

Afterwards, an opening O3 is formed in the dielectric layer 402, and a conductive structure 404 (e.g., a conductive via, or a conductive plug) is formed in the opening O3 to form a semiconductor structure 40, as shown in FIG. 4B in accordance with some embodiments. The opening O3 may be formed by a lithography process followed by an etching process. The etching selectivity of the hard mask 322 with respect to the dielectric layer 402 may be high, and the etching process for forming the opening O3 may be a self-aligned etching process. The opening O3 may be filled with applicable conductive materials to form the conductive structure 404 using a physical vapor deposition process, an atomic layer deposition process, a plating process, a chemical vapor deposition process, another applicable process, or a combination thereof. For example, the conductive structure 404 may be made of tungsten, cobalt, titanium, aluminum, copper, tantalum, platinum, molybdenum, silver, manganese, zirconium, ruthenium, another applicable conductive material, or a combination thereof.

FIGS. 5A and 5B illustrate various stages of a method for forming a semiconductor structure 50, in accordance with some embodiments. The stages illustrated in FIGS. 5A and 5B may follow the stage illustrated in FIGS. 3G and 4A.

The S/D contact structure 324 is recessed, as shown in FIG. 5A in accordance with some embodiments. For example, an etching process (e.g., a dry etching process, a wet etching process, or a combination thereof) may be used to recess the S/D contact structure 324.

Afterwards, a hard mask 502 is selectively formed on the S/D contact structure 324, as shown in FIG. 5A in accordance with some embodiments.

In some embodiments, the interlayer dielectric layer 318 and/or the hard mask 322 is similar to the second structure 104 of the above embodiments, the S/D contact structure 324 is similar to the first structure 102 of the above embodiments, and the hard mask 502 is similar to the third structure 110 of the above embodiments. Therefore, in these embodiments, the method for forming the hard mask 502 can include forming the heat-curable layer 106 on the first structure 102 (e.g., the S/D contact structure 324) and on the second structure 104 (e.g., the interlayer dielectric layer 318 and/or the hard mask 322), using the laser beam L1 to heat the first structure 102 and the second structure 104, removing the uncured portion of the heat-curable layer 106 on first structure 102, selectively depositing the third material 108 on the first structure 102, and removing the cured portion of the heat-curable layer 106 on the second structure 104 while leaving the third material 108 on the first structure 102 to serve as the hard mask 502.

In some embodiments, the interlayer dielectric layer 318 and/or the hard mask 322 is similar to the fifth structure 204 of the above embodiments, the S/D contact structure 324 is similar to the fourth structure 202 of the above embodiments, and the hard mask 502 can be made of the sixth material 206 of the above embodiments. Therefore, in these embodiments, the method for forming the hard mask 502 can include heating the fifth structure 204 (e.g., the interlayer dielectric layer 318 and/or the hard mask 322) and the fourth structure 202 (e.g., the S/D contact structure 324) using the laser beam L2, and selectively depositing the sixth material 206 on the fourth structure 202 to serve as the hard mask 502.

In some embodiments, the top surface 502T of the hard mask 502 is planarized to be substantially level with the top surface 318T of the interlayer dielectric layer 318 and/or the top surface 322T of the hard mask 322. In some embodiments, the top surface 502T of the hard mask 502, the top surface 318T of the interlayer dielectric layer 318, and the top surface 322T of the hard mask 322 are coplanar. In some embodiments, since the hard mask 502 is selectively formed on the S/D contact structure 324, the loading of the planarization process may be reduced, which may in turn reduce the manufacturing time and manufacturing cost.

Afterwards, a dielectric layer 504 is formed on the hard mask 322 and the hard mask 502, as shown in FIG. 5B in accordance with some embodiments. In some embodiments, the dielectric layer 504 is formed on the interlayer dielectric layer 318, and the methods and materials of forming the dielectric layer 504 may be the same as or similar to those of the interlayer dielectric layer 318.

Afterwards, openings O4 and O5 are formed in the dielectric layer 504, and conductive structures 506 and 508 (e.g., conductive via, or conductive plug) are formed in the openings O4 and O5 to form a semiconductor structure 50, as shown in FIG. 5B in accordance with some embodiments. In some embodiments, the opening O4 and the conductive structure 506 formed in the opening O4 penetrate through the hard mask 502, and the opening O5 and the conductive structure 508 formed in the opening O5 penetrate through the hard mask 322. The conductive structure 508 may be electrically connected to the gate electrode layer 320b of the metal gate structure 320, and the conductive structure 506 may be electrically connected to the S/D contact structure 324.

The openings O4 and O5 may be formed by a lithography process followed by an etching process. The openings O4 and O5 may be filled with applicable conductive materials to form the conductive structures 506 and 508 using a physical vapor deposition process, an atomic layer deposition process, a plating process, a chemical vapor deposition process, another applicable process, or a combination thereof. For example, the conductive structures 506 and 508 may be made of tungsten, cobalt, titanium, aluminum, copper, tantalum, platinum, molybdenum, silver, manganese, zirconium, ruthenium, another applicable conductive material, or a combination thereof.

The semiconductor structure 50 of the embodiments illustrated in FIGS. 5A and 5B includes both the hard mask 322 and the hard mask 502. However, in some embodiments, the semiconductor structure 50 includes the hard mask 502 but does not include the hard mask 322.

As described previously, in some embodiments, the first structure 102 and the second structure 104 are heated to the first temperature A1 and the second temperature A2 by the laser beam L1. The first temperature A1 may be lower than the second temperature A2, and thus the portion 106a of the heat-curable 106 on the first structure 102 may be selectively removed. Therefore, the third material 108 may be selectively formed on the first structure 102.

As described previously, in some embodiments, the fourth structure 202 and the fifth structure 204 are heated to the fourth temperature A4 and the fifth temperature A5 by the laser beam L2. The fourth temperature A4 may be higher than the fifth temperature A5. Therefore, the sixth material 206 may be selectively formed on the fourth structure 202.

Embodiments of methods for forming semiconductor structures are provided. The method for forming semiconductor structure includes forming a first material and a second material on a semiconductor substrate. The first material is different from the second material. The first material and the second material are heated by a laser beam. Since the laser beam heats the first material and the second material to different temperatures, a third material may be selectively formed on the first material.

In some embodiments, a method for forming a semiconductor structure is provided. The method includes forming a first material and a second material on a semiconductor substrate. The first material is different from the second material. The method also includes heating the first material to a first temperature and the second material to a second temperature with a laser beam. The first temperature is higher than the second temperature. The method also includes depositing a first precursor on the first material, depositing a second precursor on the first material, and reacting the first precursor and the second precursor to form a third material on the first material.

In some embodiments, a method for forming a semiconductor structure is provided. The method includes forming a first material and a second material on a semiconductor substrate. The first material is different from the second material. The method also includes coating a heat-curable layer on the first material and the second material, and heating the first material and the second material with a laser beam. The laser beam heats the first material to a first temperature, and the laser beam heats the second material to a second temperature that is higher than the first temperature. The method also includes removing a first portion of the heat-curable layer on the first material to expose the first material while leaving a second portion of the heat-curable layer on the second material, depositing a third material on the first material, and removing the second portion of the heat-curable layer.

In some embodiments, a method for forming a semiconductor structure is provided. The method includes forming a first material and a second material on a semiconductor substrate. The first material is different from the second material. The method also includes heating the first material to a first temperature and the second material to a second temperature with a laser beam. The difference between the first temperature and the second temperature is in a range from about 100° C. to about 300° C. The method also includes selectively depositing a third material on the first material.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a semiconductor structure, comprising:
    forming a first material and a second material on a semiconductor substrate, wherein the first material is different from the second material, and wherein the first material is a metal, a dielectric material or a semiconductor material;
    heating the first material to a first temperature and the second material to a second temperature with a laser beam, wherein the first temperature is higher than the second temperature; and
    depositing a first precursor on the first material;
    depositing a second precursor on the first material; and
    reacting the first precursor and the second precursor to form a third material on the first material.

2. The method for forming a semiconductor structure as claimed in claim 1, wherein the first temperature is in a range from 200° C. to 600° C.

3. The method for forming a semiconductor structure as claimed in claim 1, wherein the first precursor is deposited on the first material in a chamber, and the second precursor is deposited on the first material in the chamber.

4. The method for forming a semiconductor structure as claimed in claim 1, wherein the laser beam heats the first material to the first temperature and the second material to the second temperature during the deposition of the first precursor.

5. The method for forming a semiconductor structure as claimed in claim 1, wherein the first temperature is higher than the second temperature by 100° C. to 300° C.

6. The method for forming a semiconductor structure as claimed in claim 1, further comprising:
    forming a fin structure over the semiconductor substrate;
    forming a source/drain structure on the fin structure, wherein the first material is formed on the source/drain structure;
    forming a gate structure across and on the fin structure; and
    planarizing the third material on the first material, wherein a top surface of the third material and a top surface of the second material are coplanar.

7. A method for forming a semiconductor structure, comprising:
    forming a first material and a second material on a semiconductor substrate, wherein the first material is different from the second material, and wherein the first material is a metal, a dielectric material or a semiconductor material;
    coating a heat-curable layer on the first material and the second material;
    heating the first material and the second material with a laser beam, wherein the laser beam heats the first material to a first temperature, and the laser beam heats the second material to a second temperature that is higher than the first temperature;
    removing a first portion of the heat-curable layer on the first material to expose the first material while leaving a second portion of the heat-curable layer on the second material;
    depositing a third material on the first material; and
    removing the second portion of the heat-curable layer.

8. The method for forming a semiconductor structure as claimed in claim 7, wherein a ratio of a first thickness of a first portion of the third material on the second material to a second thickness of a second portion of the third material on the first material is in a range from 0.001 to 0.1.

9. The method for forming a semiconductor structure as claimed in claim 8 wherein a ratio of the first thickness of the first portion of the third material on the second material to a third thickness of the second portion of the heat-curable layer is in a range from 0.001 to 0.1.

10. The method for forming a semiconductor structure as claimed in claim 7, wherein a first hardness of the first portion of the heat-curable layer on the first material is lower than a second hardness of the second portion of the heat-curable layer on the second material during or after heating the first material and the second material with the laser beam.

11. The method for forming a semiconductor structure as claimed in claim 7, wherein the second temperature is higher than the first temperature by 100° C. to 300° C.

12. The method for forming a semiconductor structure as claimed in claim 7, further comprising:
    forming a fin structure on the semiconductor substrate, wherein the first material is formed across the fin structure and is configured to be a gate electrode layer; and
    planarizing the third material on the gate electrode layer, wherein a top surface of the third material and a top surface of the second material are coplanar.

13. A method for forming a semiconductor structure, comprising:
    forming a first material and a second material on a semiconductor substrate, wherein the first material is different from the second material, and wherein the first material is a metal, a dielectric material or a semiconductor material;
    heating the first material to a first temperature and the second material to a second temperature with a laser beam, wherein a difference between the first temperature and the second temperature is in a range from 100° C. to 300° C.; and
    selectively depositing a third material on the first material without depositing on the second material.

14. The method for forming a semiconductor structure as claimed in claim 13, wherein the first material is a metal, and the second material is a dielectric material.

15. The method for forming a semiconductor structure as claimed in claim 14, further comprising:
    forming a fin structure over the semiconductor substrate, wherein the first material is formed across the fin structure and is configured to be a gate electrode layer.

16. The method for forming a semiconductor structure as claimed in claim 15, further comprising:
    planarizing the third material on the gate electrode layer, wherein a top surface of the gate electrode layer is lower than a top surface of the second material, and a top surface of the third material is level with the top surface of the second material.

17. The method for forming a semiconductor structure as claimed in claim 14, further comprising:
    forming a fin structure on the semiconductor substrate;
    forming a source/drain structure on the fin structure; and
    forming a gate structure across and on the fin structure, wherein the first material is formed over the source/drain structure.

18. The method for forming a semiconductor structure as claimed in claim 17, further comprising:
    planarizing the third material on the first material, wherein a top surface of the first material is lower than a top surface of the second material, and a top surface of the third material is level with the top surface of the second material.

19. The method for forming a semiconductor structure as claimed in claim 13, wherein the first material is a dielectric material, and the second material is a metal.

20. The method for forming a semiconductor structure as claimed in claim 13, wherein the first material is a dielectric material, and the second material is a semiconductor material.

* * * * *